United States Patent [19]

Coyle et al.

[11] Patent Number: 4,868,773

[45] Date of Patent: Sep. 19, 1989

[54] DIGITAL FILTERING BY THRESHOLD DECOMPOSITION

[75] Inventors: Edward J. Coyle; Neal C. Gallagher, Jr., both of West Lafayette; Steven C. Bass, Stockwell, all of Ind.; Joseph P. Fitch, Livermore, Calif.; Ronald G. Harber, West Lafayette, Ind.

[73] Assignee: Purdue Research Foundation, West Lafayette, Ind.

[21] Appl. No.: 111,112

[22] Filed: Oct. 22, 1987

Related U.S. Application Data

[63] Continuation of Ser. No. 712,392, Mar. 15, 1985, abandoned.

[51] Int. Cl.$^4$ ............................................. G06F 15/31
[52] U.S. Cl. ................................................ 364/724.01
[58] Field of Search ... 364/724, 728, 715, 900 MS File, 364/724.01, 749; 382/28

[56] References Cited

U.S. PATENT DOCUMENTS

| | | | |
|---|---|---|---|
| 4,375,081 | 2/1983 | Blesser | 364/724 |
| 4,389,539 | 6/1983 | Watanabe et al. | 364/724 X |
| 4,513,440 | 4/1985 | Delman | 364/900 |
| 4,534,041 | 8/1985 | Münter | 364/724 |
| 4,569,030 | 2/1986 | Butterweck et al. | 364/724 |
| 4,603,430 | 7/1986 | Sacks | 382/28 |
| 4,618,941 | 10/1986 | Linder et al. | 364/724 |
| 4,623,980 | 11/1986 | Vary | 364/724 |

OTHER PUBLICATIONS

E. Ataman, V. Aatre and K. Wong, "A Fast Method for Real-Time Median Filtering", IEEE Trans. Acoust., Speech & Signal Processing, vol. ASSP-28, No. 4, pp. 415-421 (Aug. 1980).

N. Gallagher, Jr., and G. Wise, "A Theoretical Analysis of the Properties of Median Filters", IEEE Trans. Acoust., Speech & Signal Processing. vol. ASSP-29, No. 6, pp. 1136-1141 (Dec. 1981).

G. Arce and N. Gallagher, Jr., "State Description for the Root-Signal Set of Median Filters", IEEE Trans. Acoust., Speech & Signal Processing, vol. ASSP-30, No. 6, pp. 894-902 (Dec. 1982).

T. Huang, G. Yang and G. Tang, "A Fast Two-Dimensional Median Filtering Algorithm", IEEE Trans. Acoust., Speech & Signal Processing, vol. ASSP-27, No. 1, pp. 13-18 (1979).

K. Oflazer, "Design and Implementation of a Single Chip 1-D Median Filter", IEEE Trans. Acoust., Speech & Signal Processing, vol. ASSP-31, No. 5, pp. 1164-1168 (1983).

B. Fotouhi and D. Hodges, "High Resolution A/D Conversion in MOS/LSI", IEEE J. Solid-State Circuits, vol. SC-14, pp. 920-926 (1979).

E. Gilbert, "Lattice Theoretic Properties of Frontal Switching Functions", Journal of Math and Phys., vol. 33, pp. 57-67 (1954).

N. Gallagher, "Median Filters: Properties and Applications", 16th Asilomar Conference on Circuits, Systems, and Computers, Nov. 8-10, Asilomar, Calif. (1982).

K. Preston, Jr., "Cellular Logic Computers for Pattern Recognition", *IEEE Computer*, pp. 36-47 (Jan. 1983).

S. R. Sternberg, "Biomedical Image Processing", *IEEE Computer*, pp. 22-34 (Jan. 1983).

(List continued on next page.)

Primary Examiner—Gary V. Harkcom
Assistant Examiner—Long T. Nguyen
Attorney, Agent, or Firm—Barnes & Thornburg

[57] ABSTRACT

A method and apparatus of digitally filtering an M-level signal decomposes the M-level signal into M−1 binary threshold signals by thresholding it at each value from 1 to M−1. The kth threshold signal has the value 1 at a given position if and only if the input signal is at least k at that position; otherwise it has the value 0. Filtering each of the M−1 threshold signals with a desired binary operator. Finally, the binary outputs from all the filters are summed bitwise to produce a digitally filtered output signal.

14 Claims, 10 Drawing Sheets

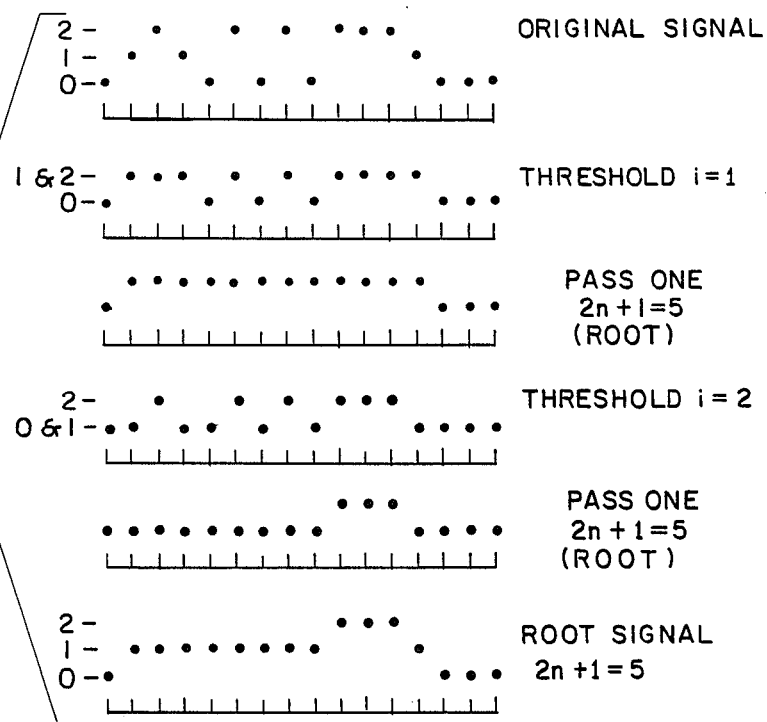
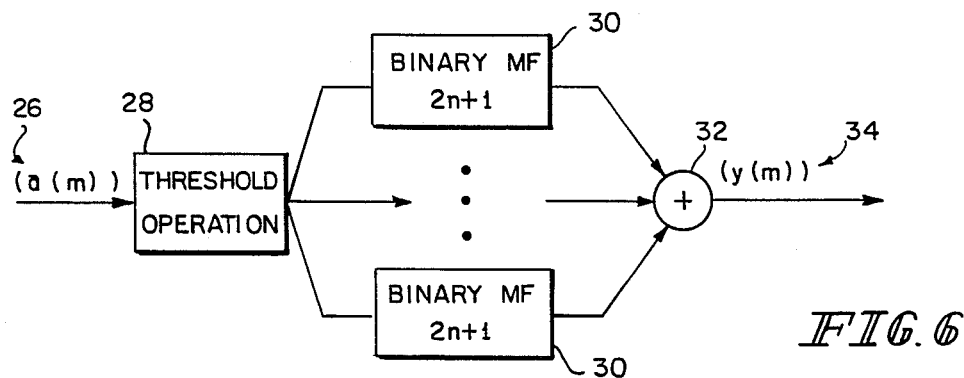
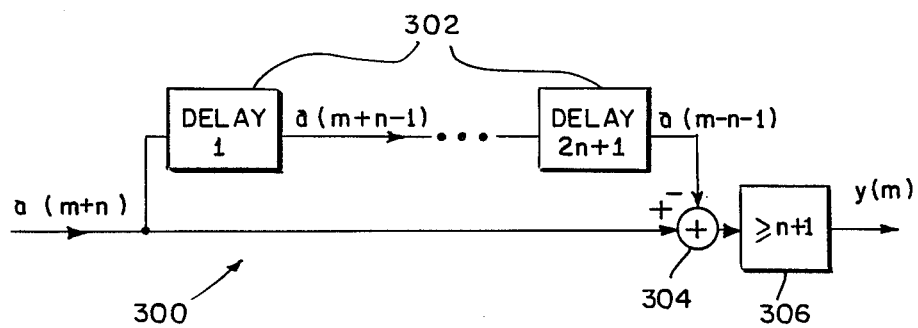
FIG. 5
FIG. 6
FIG. 7

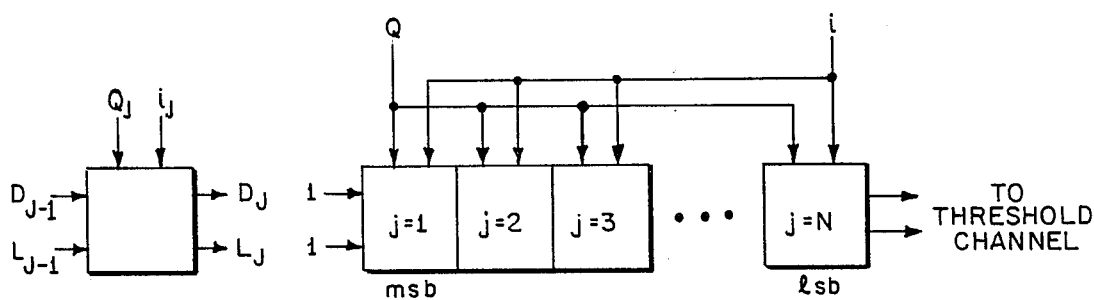
*FIG. 12*
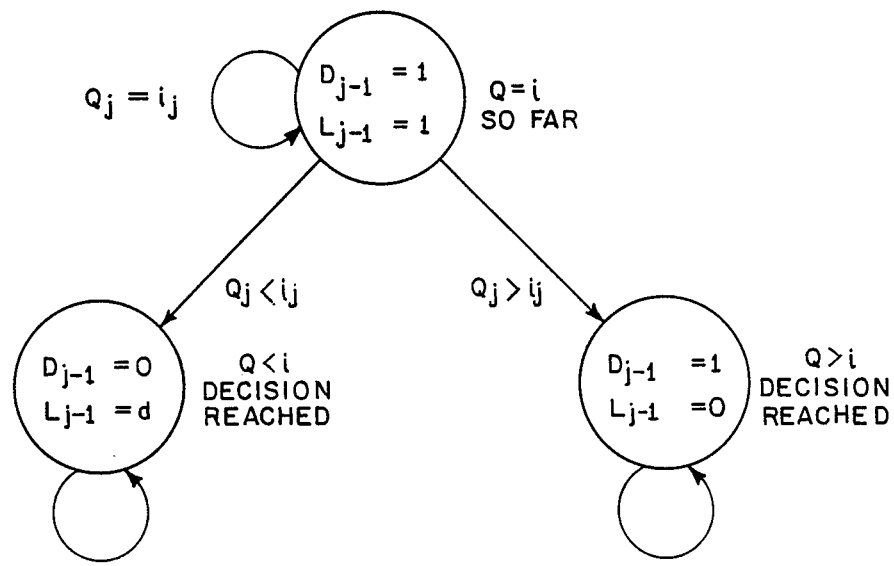
*FIG. 13*
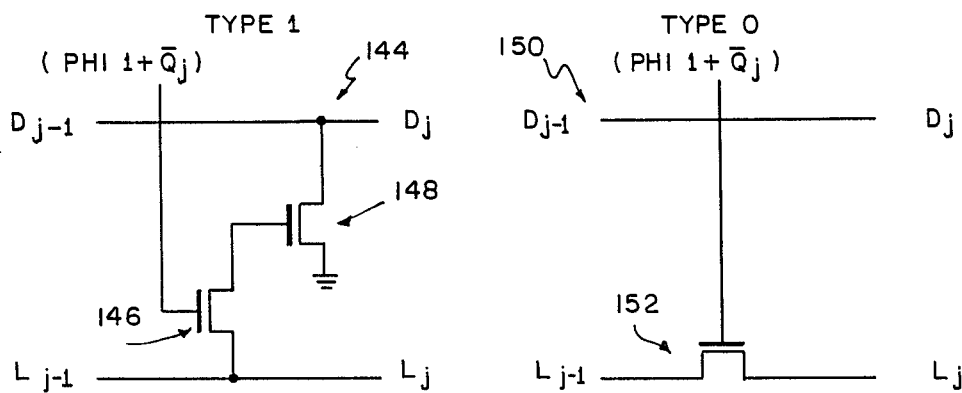
*FIG. 14a*     *FIG. 14b*

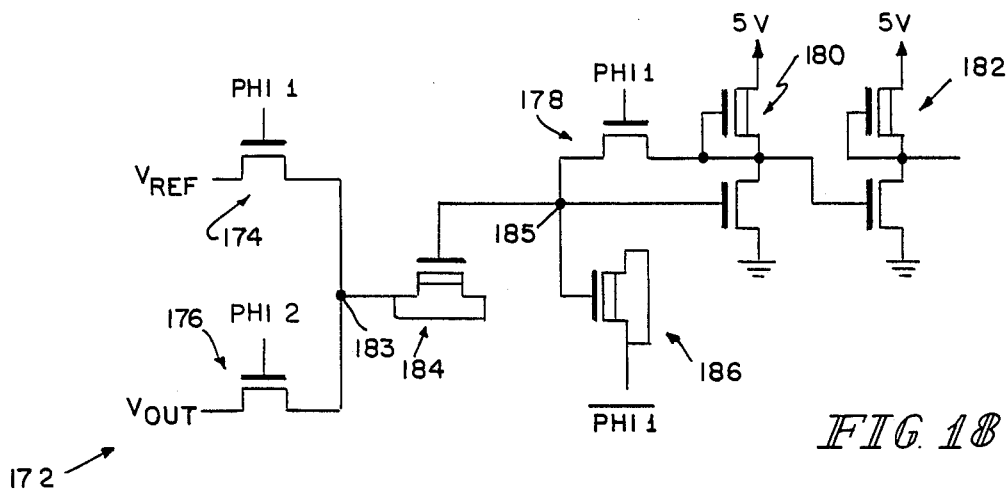
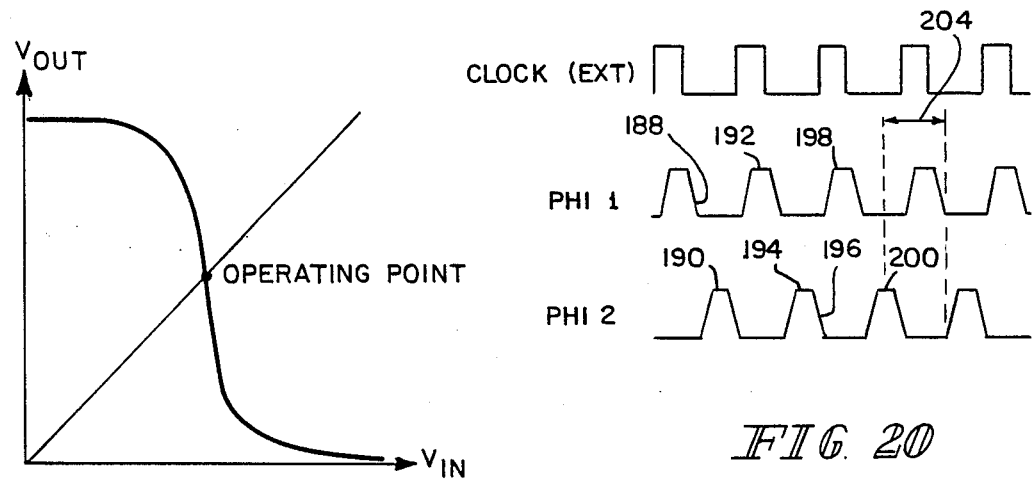
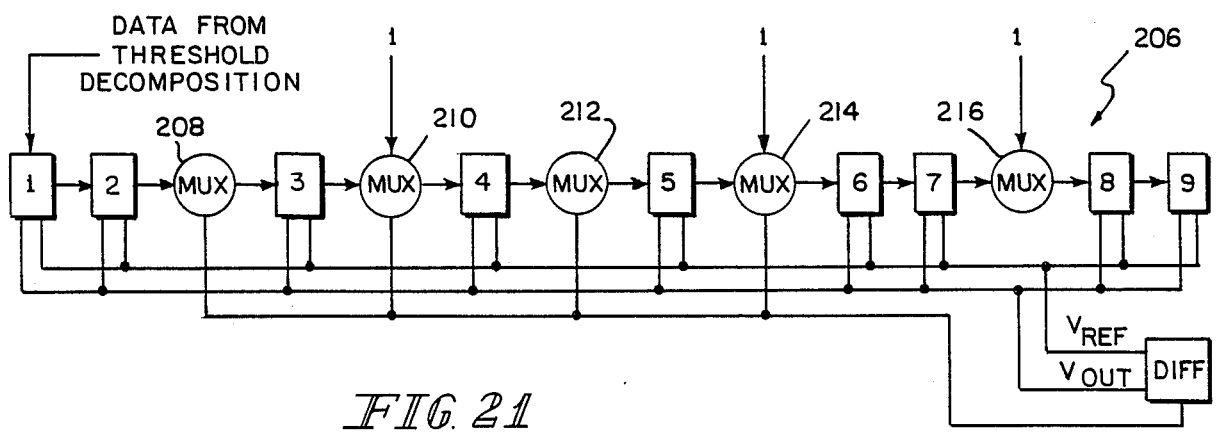

DIGITAL FILTERING BY THRESHOLD DECOMPOSITION

STATEMENT AS TO RIGHTS TO INVENTIONS MADE UNDER FEDERALLY-SPONSORED RESEARCH AND DEVELOPMENT

This invention was made with government support under Research Grant ECS-8306235 from the National Science Foundation. The government may have rights in this invention.

This application is a continuation of application Ser. No. 712,392 filed 03/15/85, now abandoned.

This invention relates to filters, and more particularly, to an improvement in digital filters, particularly of the ranked order type.

BACKGROUND OF THE INVENTION

Digital signal processing techniques are used in many signal processing systems. Examples include image processing systems, radar and sonar systems, and digital communication systems. Any system in which digital computers, or digital hardware, or both are used to transmit, store, extract, enhance, code, decode, or filter signals containing information utilizes digital signal processing.

One class of signal processing techniques that is used in many of the above-mentioned systems is the class of ranked order filters. Ranked order operations offer robust performance in signal processing applications in any dimension. They are usually easy to implement and perform well in many situations in which linear filters fail. For instance, they very effectively reduce high frequency and impulsive noise in digital images without the extensive blurring and edge destruction associated with linear filters. Other successful applications of these filters include the smoothing of noisy pitch contours in speech signals, data compression in block truncation coding schemes, and speckle noise reduction in coherent imaging systems.

Perhaps the most familiar example of ranked order filtering operations is the use of the median filter. Investigations over the last few years have shown that this filter has many interesting properties. For instance, it has been shown that a median filter maps a class of one dimensional input signals into an associated set of root signals. Each of these root signals is by definition invariant to additional filter passes and is the result of repeated filter passes on one or more of the input signals. N. C. Gallagher and G. L. Wise, "A Theoretical Analysis Of The Properties Of Median Filters," IEEE Trans. Acoust., Speech, Signal Processing, Vol. ASSP-29, pp. 1136–41 (December 1981).

Median filters are used, for example, in ultrasonic imaging systems (such as CAT-scanners), image processing systems, and image coding systems. They are used because they have been found to perform certain tasks, such as the removal of impulsive noise from data, both very well and very fast. However, regardless of how fast information processing devices, such as digital filters, can process information, it is always desirable for such devices to process information faster.

By improving the speed at which median filters can operate, systems in which they are currently used will be able to function much faster. For instance, CAT-scanners could produce the same quality images now produced, but in much shorter times. This would permit the machines to examine more patients each day, thus lowering the medical costs of the individual patients.

SUMMARY OF THE INVENTION

It is therefore an object of this invention to provide a digital filter with enhanced signal processing characteristics.

It is a further object of this invention to provide a digital filter that can filter a digitized signal more quickly.

The increased speed benefits of this invention are not limited to the improvement of current applications. Increased speed in ranked order digital filters should make feasible new applications as well. The real-time processing of very large digital images is made more feasible by this concept. Increased speed provides the very fast noise reduction and image coding capabilities that are needed.

According to the invention, a digital filter comprises means for decomposing a digitized input signal into a plurality of binary signals. The digital filter also has binary filters for filtering each of the binary signals. Additionally, the digital filter includes means for combining the filtered binary signals to produce a filtered output signal.

BRIEF DESCRIPTION OF THE DRAWINGS

Additional features and advantages of the invention will become apparent to those skilled in the art upon consideration of the following detailed description of a preferred embodiment exemplifying the best mode of carrying out the invention as presently perceived. The detailed description particularly refers to the accompanying figures in which:

FIG. 5 is a schematic illustration of recursive median filtering by the threshold decomposition filtering of this invention;

FIG. 6 is a schematic illustration of an implementation of median filtering by the threshold decomposition filtering of this invention;

FIG. 7 illustrates a block diagram of a circuit for a binary median filter;

FIG. 12 illustrates a block diagram of a threshold decomposition comparator;

FIG. 13 illustrates a state transition diagram for threshold decomposition;

FIG. 14a illustrates a schematic for a "type 1" cell;

FIG. 14b illustrates a schematic for a "type 0" cell;

FIG. 18 illustrates a schematic for a differencing circuit;

FIG. 19 illustrates a graph of the biasing of inverter 180 of FIG. 18 in its high gain region;

FIG. 20 illustrates a timing diagram for a circuit implementing a threshold decomposition filtering technique of this invention;

FIG. 21 illustrates a block diagram of a circuit for a threshold channel;

DESCRIPTION OF THE PREFERRED EMBODIMENTS OF THE INVENTION

This invention can best be described with reference to Ranked Order Filters (ROFs) in general, and, more specifically, with reference to median filters. It should be understood, however, that the invention is not limited to ROFs.

ROFs are the most common examples of nonlinear, discrete-time signal processors. Implicit in the definition of a non-recursive ROF is a movable data window that permits the filter to examine only the M most recent input samples. The traditional method, i.e., before the threshold decomposition of this invention, of determining the output sample that should be produced from the current window contents is a two-step process. First, the sample values within the window are sorted into numerical order. Then, the value occupying a prescribed position within the order is selected as the output sample. When a new input sample becomes available, it displaces the oldest input sample currently residing within the window. The ordering and selection process is then repeated.

If M is odd (the usual case), selecting the middle value within the ordering list makes the ROF a median filter. Alternatively, deciding always to select either the first or last sample in the ranking yields a ROF that queues on the maximum or minimum value, respectively, within the current window. Clearly, other ranked order selections are available, though at this time little is known about their properties and usefulness in signal processing tasks.

The implementation of a standard ranked order filter requires a simple nonlinear digital operation. To begin, a window that spans $2n+1$ points is slid across a sampled signal of length L. The filter output at each window position is given the same position as the sample point at the center of the window and is set equal to the value of the r'th largest sample in the window. Start up and end effects are accounted for by appending n samples to both the beginning and the end of the input sequence. The front appended samples are given the value of the first sample of the signal and the rear appended samples are given the value of the last sample of the signal.

Figure 1:
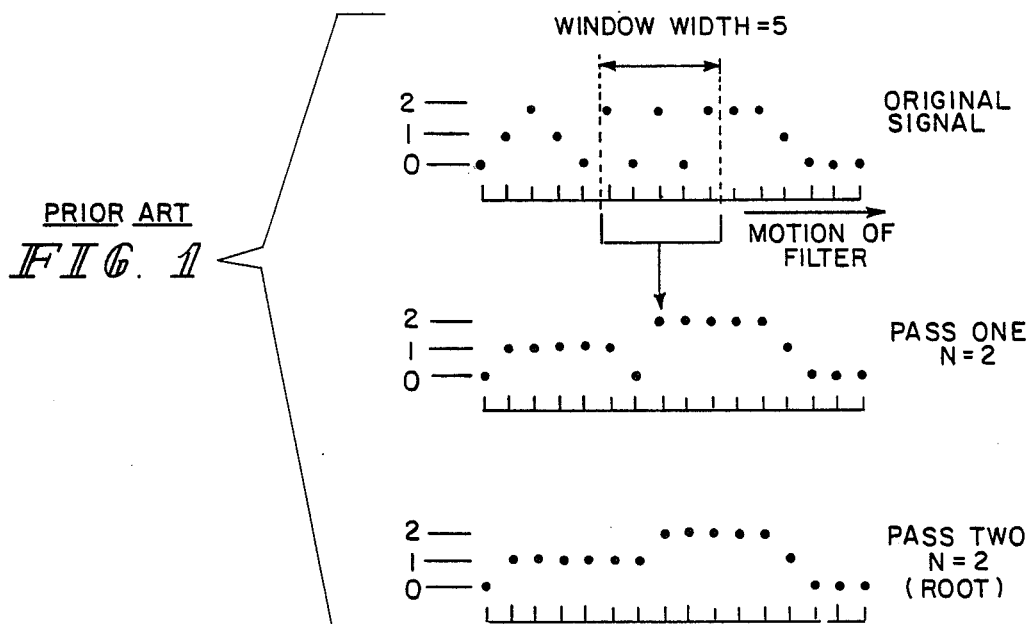
FIG. 1 is a schematic illustration of a three level signal filtered to a root in two passes by a prior art median filter having a window width of five.

To illustrate the above filtering process consider the effects of a median filter on the signal in FIG. 1. The median filter in the figure has window width of five so that $n=2$ and $r=3$. The filter is applied to a signal with three levels. The output is given for each pass until a signal which is invariant to additional passes is reached. This invariant signal is known as the root of the filter. The basic idea behind the median filter is to rank the samples in the window and select the median value as the filter output.

Figure 2:
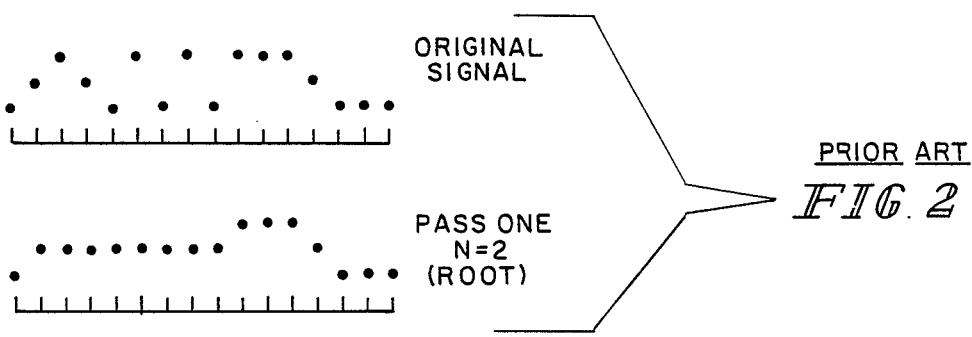
FIG. 2 is a schematic illustration of a three level signal filtered to a root by one pass of a prior art recursive median filter having a window width of five.

Recursive median filtering is a modification of the standard process in which the center sample is replaced by the computed median before the window is shifted to the next point. Therefore, the N leftmost samples in a window are computed medians. FIG. 2 illustrates the results of applying a recursive median filter of window width five to the same signal used in FIG. 1. Only one pass is required to reach a root with a recursive median filter. As illustrated in FIG. 2, for a recursive median filter, the root is different from the root of the standard filter appearing in FIG. 1 even though the input signal is the same.

The significance of this operation in the realm of digital signal processing is a consequence of the following definitions and properties. They provide an initial intuitive idea of the effect of the median filter on digital signals. The definitions, for a median filter with window width $2N+1$ are:

(1) A "constant neighborhood" is at least $N+1$ consecutive, identically valued points.

(2) An "edge" is a monotonic region between two constant neighborhoods of different values. The connecting monotonic region cannot contain any constant neighborhoods.

(3) An "impulse" is a set of N or fewer points whose values are different from the surrounding regions and whose surrounding regions are constant neighborhoods.

(4) A "root signal" is a signal which is invariant to the median filter; that is, it is not altered in any way by the median filter.

The importance of these definitions and the feeling for the median filter is developed in the following easily stated but hard to prove theorems. For each of these theorems it is assumed that a median filter with a window width of $2N+1$ is being applied to a signal with L points:

I. A necessary and sufficient condition for a signal to be invariant to the median filter, i.e., to be a "root signal," is that the signal consist only of constant neighborhoods and edges. It cannot contain impulses.

II. Passing the median filter over a signal which is not a "root signal" will produce a new signal. If C is a constant number, L the signal length, and $2N+1$ the filter window width, after at most CL/N passes, the signal produced will be a "root signal".

To show how these results are used, suppose there is a high resolution digital image in which the features of greatest interest "look" like constant regions and sharp edges. A picture of a house would be an example of such an image since it has large regions which are the same color and many sharp edges where these regions meet. Suppose further that this image is corrupted with impulsive noise, like speckle noise. This image is passed through a median filter until an image invariant to further passes, that is, a root, is obtained. The resulting image will look like the house without the speckles, since the median filter will not alter the constant neighborhoods and edges from the house, but will remove the impulses.

As can be seen from the preceding discussion, median filtering is a highly nonlinear operation. The traditional tools of linear analysis, i.e., the representation of signals as the superposition of sinusoids and the separate filtering of each sinusoid, cannot be used to analyze the effects of this nonlinear operation on arbitrary signals. An example of the difficulty caused by the loss of these tools is that many properties of the median filter which can be easily obtained for binary signals are not readily extended to signals with an arbitrary number of levels. To make such extensions more natural, a decomposition and a set of simple signals are needed which perform the same function for median filters that superposition and the set of sinusoids perform for linear filters. The invention described below provides the decomposition and the set of simple signals that are needed.

This invention, termed "filtering by threshold decomposition," will be described in the context of median filtering. It applies to other classes of digital filters, generally termed "Stack Filters" in this application, and specifically to the class of Ranked Order Filters, of which median filters are a subset. Median filtering by threshold decomposition comprises a filtering technique wherein filtering a discrete time signal which takes on K possible values with a median or other ranked order filter is equivalent to (i) decomposing the signal into K−1 binary signals through a method called threshold decomposition, (ii) filtering each binary signal with a binary median or other ranked order filter, and (iii) adding these filtered binary signals together to produce the output of the filter.

The significance of this new concept is that it makes both the analysis and the implementation of median filters much simpler. The reason is that the decomposition in step (i) above produces binary signals, i.e., signals which take on only the values 0 or 1. The effect of median-type filters on binary signals is well understood, and the implementation of these filters is much simpler if only a binary signal appears at the input. Thus, this new concept leads both to greater understanding of these filters and to an implementation which is well suited to VLSI technology and very fast operation.

Figure 3:
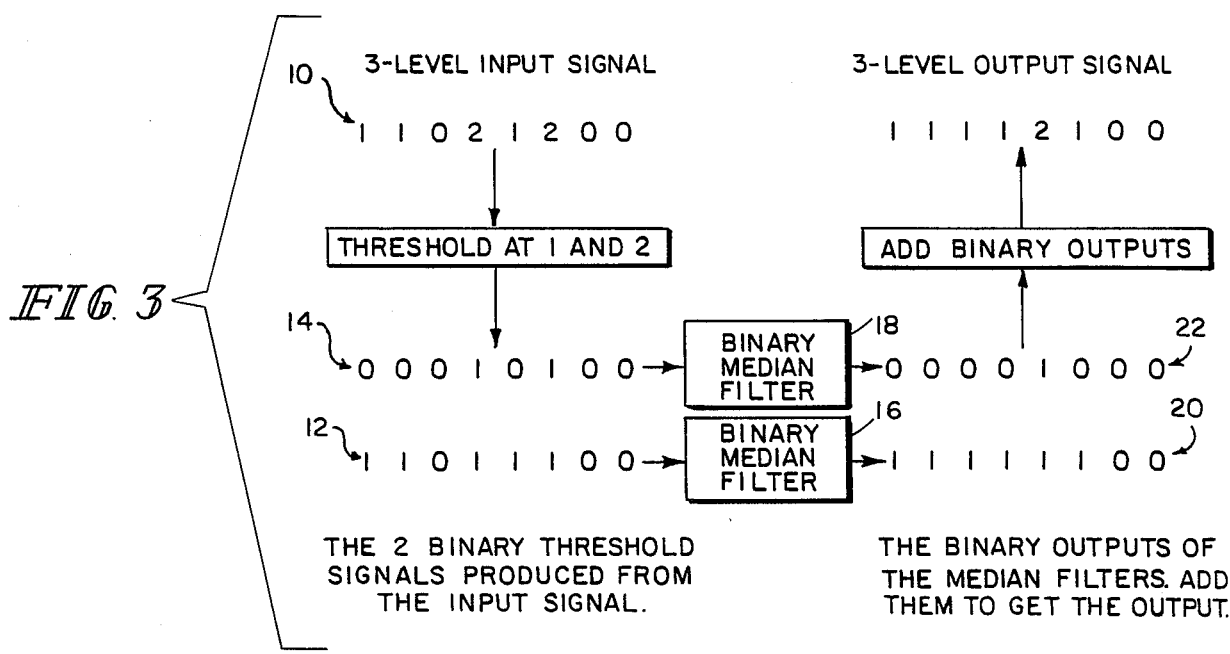
FIG. 3 is a schematic illustration of median filtering by the threshold decomposition filtering of this invention.

The threshold decomposition property is a superposition property particularly useful with median filters and other ranked order operations which inhibit this property. This property is such that passing a discrete time signal which takes on M values $0, 1, \ldots, M-1$, through a ranked order operator is equivalent to the following procedure, which is illustrated in FIG. 3 with a median filter having a window width of three:

(1) An M-level signal is decomposed into M−1 binary threshold signals by thresholding it at each value from 1 to M−1. The $k^{th}$ threshold signal has the value 1 at a given position if and only if the input signal is at least k at that position; otherwise it has the value 0. In FIG. 3, this decomposition operation produces two binary signals since the input signal takes on three values. The sum of the threshold signals is always the original input signal. Also, a threshold signal for a threshold of zero adds no useful information since all input samples are greater than or equal to zero.

(2) Each of the M−1 threshold signals is filtered with the desired ranked-order operator. Since each signal is filtered independently, these M operations can be implemented in parallel, as shown in FIG. 3. Also, since these filters have only binary signals as inputs, they are easily implemented—all that needs to be done is to add together the bits that appear in their windows and compare the results to a threshold. If the sum exceeds the threshold, the output is 1; otherwise, the output is 0. The outputs of these filters are also binary signals.

(3) The binary outputs from all the filters are added to produce the output signal. This is shown on the right side of FIG. 3.

Referring to FIG. 3, the 3-valued input signal sequence 10 is thresholded at a threshold level of 1 to yield the binary threshold signal sequence 12 and is also thresholded at a level of 2 to yield the binary threshold signal sequence 14. Binary threshold signal sequence 12 is operated on by a binary median filter 16 to yield a binary output signal sequence 20. Binary threshold signal sequence 14 is operated on by a binary median filter 18 to yield binary output signal sequence 22. In the embodiment shown, binary median filters 16, 18 are identical. Binary output signal sequences 20, 22 are then combined, illustratively by adding them together on a bit-by-bit basis, to generate a 3-level output signal sequence 24. Output signal sequence 24 comprises a filtered signal produced by filtering input signal 10 according to the threshold decomposition filtering of this invention.

Illustratively referring to median filtering, the threshold decomposition filtering of this invention is explained in greater detail. Assume that the input signal is a discrete sequence of length L which takes on the value a(m) at position m, $1 \leq m \leq L$, and that for each m, a(m) is quantized to one of the k values $0, 1, \ldots, k-1$. Let $y_s(m)$ be the output at position m of a standard median filter with window width 2N+1 applied to the input sequence a(m).

The level i threshold decomposition of the original signal at point m is defined as $$t_0^i(m) = \begin{cases} 1 & , \text{if } a(m) \geq i \\ 0 & , \text{if } a(m) < i \end{cases} \quad (1)$$

where i indicates the threshold level, $1 \leq m \leq L$, and $1 \leq i \leq k-1$. Applying the standard median filter to these thresholded values generates another binary sequence $$x_s^i(m) = \text{median}\{t_0^i(m-N), \ldots, t_0^i(m), \ldots, t_0^i(m+N)\} \quad (2)$$

where start up and end effects are accounted for by repeating the first or last value of the signal as described previously.

The relation of the binary valued, median filtered threshold sequence to the output $y_s(m)$ of the median filter applied to the original k-level signal is provided by Theorem 1.

Theorem 1: There exists a mapping f(.) from the set of binary median filtered sequences $x_s^i(m)$, $1 \leq i \leq k-1$ to the signal space of k-leveled signals such that $y_s(m) = f(x_s^i(m), 1 \leq i \leq k-1)$. Proof by Construction:

Defining I(A) to be the indicator function of the event A, that is $$I(A) = \begin{cases} 1, & \text{if } A \text{ is true} \\ 0, & \text{if } A \text{ is false} \end{cases} \quad (5)$$

The output of one filter pass on the level i threshold decomposition binary sequence at any position m, $1 \leq m \leq L$ is $$x_s^i(m) = \text{median}\{t_0^i(m-N), \ldots, t_0^i(m), \ldots, t_0^i(m+N)\} \quad (3)$$

$$= \begin{cases} 1, & \text{if } \sum_{n=-N}^{N} t_0^i(m+n) \geq N+1 \\ 0, & \text{if } \sum_{n=-N}^{N} t_0^i(m+n) \leq N \end{cases} \quad (4)$$

$$= \left\{ \sum_{n=-N}^{N} t_0^i(m+n) \geq N+1 \right\}$$

$$= I\{\text{At least } N+1 \text{ elements in } t_0^i(m-N), \ldots, t_0^i(m+N) \text{ equal } 1\} \quad (5)$$

$$= I\{\text{At least } N+1 \text{ elements in } a(m-N), \ldots, a(m+N) \text{ are } \geq i\}$$

By Equation (5) if $X_s^p(m) = 1$, then for at least $N+1$ positions in the window, the signal $a(n)$, $M - N \leq n \leq m + N$, is greater than or equal to p. But this implies that at least $N+1$ $a(n)$'s in the window are greater than or equal to q for all $q \leq p$. That is, $X_s^q(m) = 1$, $1 \leq q \leq p$. This provides the first property, called the stacking property, of the threshold decomposition.

Property 1: If $X_s^p(m) = 1$ then $X_s^q(m) = 1$ for $1 \leq q \leq p$.

$$y_s(m) = \text{median } (a(m-N), \ldots, a(m), \ldots, a(m+N)) \quad (6)$$

$$= \max (0, i: \text{At least } N+1 \text{ } a\text{'s in window are } \geq i)$$

$$= \max (0, i: I(\text{At least } N+1 \text{ } a\text{'s in window are } \geq i) = 1)$$

The combination of Equations (5) and (6) yields $$y_s(m) = \max\{0, i: x_x^i(m) = 1\}$$

and by Property 1 of the decomposition $$y_s(m) = \sum_{i=1}^{k-1} X_s^i(m) \quad (7)$$

$$= f\{X_s^i(m), 1 \leq i \leq k-1\}$$

which completes the proof of Theorem 1.

In loose terms, the function f(.) stacks the binary signals $X_s^i(m)$ on top of one another starting with $i = 1$. The value of the output at position m is then the highest level at position m in the stack at which a one appears.

The function f(.) constructed above is shown to be the inverse of the threshold decomposition by Lemma 1.

Lemma 1: The binary threshold sequences $t_s^i(m)$, $1 \leq m \leq L$, and $1 \leq i \leq k-1$, obtained by thresholding $y_s(m)$, $1 \leq m \leq L$, are identical to the binary sequences $x_x^i(m)$, $1 \leq m \leq L$, and $1 \leq i \leq k-1$, from Theorem 1.

Proof:

$$t_s^i(m) = \begin{cases} 1, & \text{if } y_s(m) \geq i \\ 0, & \text{otherwise} \end{cases}$$

From Equation (7) of the proof of Theorem 1

$$t_s^i(m) = \begin{cases} 1, & \text{if } \sum_{q=1}^{k-1} X_s^q(m) \geq i \\ 0, & \text{otherwise} \end{cases}$$

Property 1 allows a reduction to the following $$t_s^i(m) = \begin{cases} 1, & \text{if } X_s^i(m) = 1 \\ 0, & \text{otherwise} \end{cases} \quad (8)$$

$$= X_s^i(m)$$

which completes the proof of Lemma 1.

The above results show how one pass of a median filter over the input signal is equivalent to first thresholding the signal, filtering each threshold sequence, and reconstructing the output using the function f(.). This operation can clearly be repeated for each pass of the median filter until a root signal is obtained. A simple inductive argument shows that the intermediate reconstructions can be omitted. These results are summarized as follows in Theorem 2 and its corollary.

Theorem 2: Passing a median filter t times over a K valued signal is equivalent to the following three step process:

(i) Decomposing the K valued input into $K-1$ binary valued signals by thresholding it at each value from 1 to $K-1$. The k'th threshold signal has the value 1 at a given position if and only if the input signal is at least k at that position; otherwise it has the value 0.

(ii) Independently filtering each of the $K-1$ threshold signals t times with a binary median filter. Since each threshold signal is filtered independently, these filtering operations can be carried out in parallel; that is, simultaneously.

(iii) Adding up the $K-1$ binary signals produced by the filtering operations in (ii) to produce the output signal.

This theorem states the important point that for a signal to be filtered a number of times, it is only necessary to decompose the input signal once and to perform the reconstruction operation once. All of the signal passes can then be done *very quickly* and easily by a sequence of binary median filter operations applied to each threshold signal. (This is one reason that this new median filtering concept will result in much faster implementations of the median filter).

A significant consequence of Theorem 2 is that if the root signal for a particular input signal is desired, it can be easily obtained. This result is stated in the Corollary to Theorem 2, below, and is a simple consequence of the fact that a root signal can be obtained from any signal of length L by filtering that signal L/2 or more times.

Corollary to Theorem 2:

The root signal associated with a median filter having a window width of $2N+1$ can be obtained by thresholding the original signal, filtering the resulting binary signals to roots, and then mapping these binary roots back to the k-level root signal using the function f(.) constructed in Theorem 1.

Figure 4:
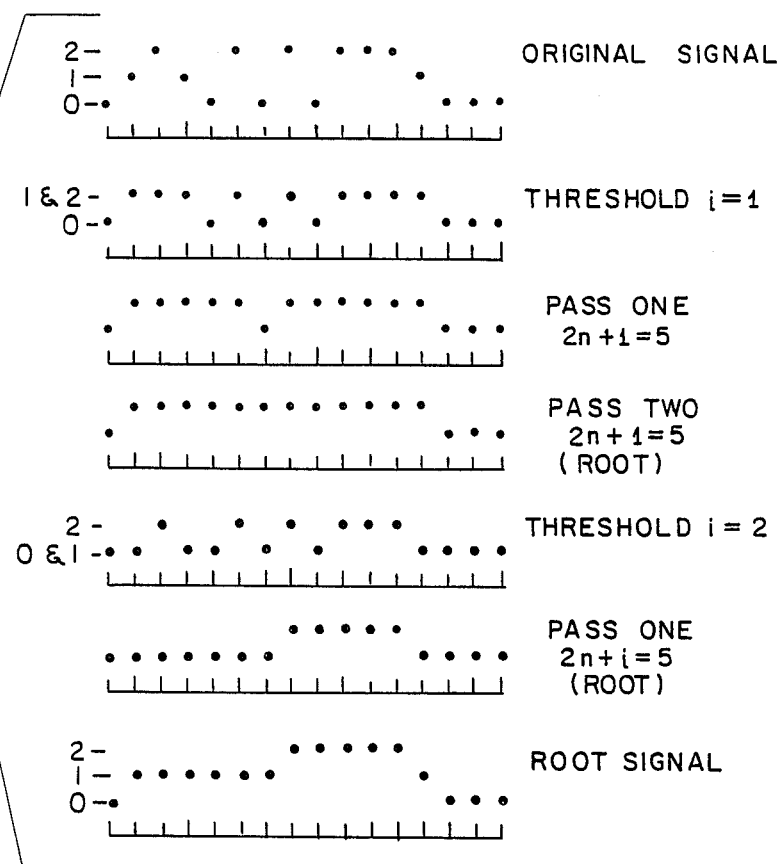
FIG. 4 is a schematic illustration of median filtering by the threshold decomposition filtering of this invention.

FIG. 1 shows a prior art median filter with a window width of 5 applied to a three level signal. FIG. 4 shows the threshold decomposition filtering of this invention in the context of a median filter with a window width of 5 applied to a three level signal. As can be seen, the results are identical, as proven above.

This result provides a new tool for both the implementation and the analysis of the median filtering operation applied to arbitrary level signals. An important and surprising consequence of this is that the reconstruction function f(.) is a linear operator—the arithmetic sum. This same technique is also valid for a general class of ranked order operators.

Recursive median filtering is a modification of the standard process in which the center sample is replaced by the computed median before the window is shifted to the next point. Therefore, the n leftmost samples in a window are computed medians. If $\{a(m)\}$ is the input sequence to the filter, $1 \leq m \leq L$, then letting $y_r(m)$ by the output of the recursive filter with window width $2n+1$ $$y_r(m) = \text{median}\{y_r(m-n), \ldots, y_r(m-1), a(m), \ldots, a(m+n)\} \quad (9)$$

FIG. 2 illustrates the results of applying a prior art recursive median filter of window width five to the same signal used for the standard filter example of FIG. 1.

Recursive median filters are known to have different properties than standard median filters. For instance, the output after one pass of a recursive median filter is always invariant to additional passes of the same filter, i.e., it is a root. As shown by comparing FIG. 2 to FIG. 1, this root may not equal the standard median filter root for the same signal. Furthermore, the output of a recursive median filter is affected not only by the window size but also by the direction in which the window slides across the signal. If a decomposition and superposition algorithm similar to Theorem 2 can be found for recursive median filters, the recursive median filter could be compared with the standard median filter by analyzing the simpler binary signal case. This is important when evaluating whether the recursive median filter on the standard median filter is appropriate for a specific application. In addition, the validity of the threshold decomposition would reduce many problems in the analysis of recursive median filters to their corresponding binary problems. In FIG. 5 the threshold decomposition technique is used to filter the signal identical to the original signal of FIG. 2 with a recursive median filter having a window width of five. The output is identical to that obtained with the prior art recursive median filter as can be seen by comparing FIGS. 2 and 5.

Theorem 3:

The root signal associated with a recursive median filter having a window width of $2n+1$ can be obtained by thresholding the original signal, applying the recursive median filter to the resulting binary signals, and then mapping these binary roots back to the k-level root signal using the function f(.) constructed in Theorem 1.

The proof of this theorem is best presented as a series of properties for recursive median filters. Let $y_r(m)$ denote the output at position m of a recursive median filter with window width $2N+1$ moving to right across the input sequence a(m). The level i threshold decomposition of the original signal at position m is defined to be $$t_0{}^i(m) = \begin{cases} 1, & \text{if } a(m) \geq i \\ 0, & \text{if } a(m) < i \end{cases} \quad (10)$$

with $1 \leq m \leq L$ and $1 \leq i \leq k; b \;-1$. Recursive median filtering the thresholded values gives another binary sequence $$x_r{}^i(m) = \text{median}\{X_r{}^i(m-N), \ldots, X_r{}^i(m-1), t_0{}^i(m), \ldots, t_0{}^i(m+N)\} \quad (11)$$

Property 1.r: $y_r(1) = f(X_r{}^i(1), 1 \leq i \leq k-1)$

That is, the reconstruction function defined in Equation (7) as f(.), works for the first point in the input signal. A similar property holds at the last point of the signal when a recursive median filter moving from right to left across the signal is used.

Proof: To start the filter at position one, N points of value a(1) are appended to the beginning of the signal. The output of the recursive filter at position one is $$\begin{aligned} y_r(1) &= \text{median}\{(a(1), \ldots, a(1), a(2), \ldots, a(N))\} \\ &= a(1) \\ &= \sum_{i=1}^{k-1} t_0{}^i(1) \end{aligned} \quad (12)$$

The level i threshold decomposition sequences recursively median filtered at position m are given by $x_r{}^i(m)$. So at position one, after appending N points, $$\begin{aligned} x_r{}^i(1) &= \text{median}\{t_0{}^i(1), \ldots, t_0{}^i(1), t_0{}^i(2), \ldots, t_0{}^i(N)\} \\ &= t_0{}^i(1) \end{aligned} \quad (13)$$

Substituting Equation (13) into Equation (12), $$\begin{aligned} y_r(1) &= \sum_{i=1}^{k-1} X_r{}^i(1) \\ &= f\{X_r{}^i(1), 1 \leq i \leq k-1\} \end{aligned} \quad (14)$$

This shows that the function f(.) from Equation (7) for the standard median filter will reconstruct the recursive median filtered threshold values at position one of the signal.

Property 2.r: If $X_r{}^p(m) = 1$ then $X_r{}^q(m) = 1$, $1 \leq q \leq p$, $1 \leq m \leq L$.

In other words, if the recursively filtered binary sequences were stacked according to threshold value, then a one occurring at some level implies that all the binary sequences of smaller threshold levels are also one. This property is called the stacking property for recursive median filters.

Proof by induction: By Property 1.r, this is true at position one of the signal. Assuming that the property holds at position $m-1$, if it holds at position m, then by induction it holds for any position of the signal. Assume that m is fixed and $X_r{}^p(n) = 1$ implies $X_r{}^q(n) = 1$ for all q such that $1 \leq q \leq p$ and $1 \leq n \leq m; b\;-1$. If for some n between one and $m-1$ $X_r{}^p(n) = 0$, then it cannot be determined whether $X_r^q(n)$ is 0 or 1 for $1 \leq q \leq p$. That is, $X_r^p(n)=0$ implies that $X_r^q(n) \leq X_r^p(n)=0$ for any $1 \leq q \leq p$. In other words, the number of ones in the sequence $X_r^p(M-N), \ldots, X_r^p(m-1)$ can only stay the same or increase as the parameter p decreases to q, $1 \leq q \leq p$. Therefore, if $$
\begin{aligned}
1 &= X_r^p(m) \\
&= \text{median } \{X_r^p(m-N), \ldots, X_r^p(m-1), \\
&\quad t_0^p(m), \ldots, t_0^p(m+N)\}
\end{aligned} \tag{15}
$$

then $$
\begin{aligned}
1 &= \text{median } \{X_r^q(m-N), \ldots, X_r^q(m-1), \\
&\quad t_0^p(m), \ldots, t_0^p(m+N)\}
\end{aligned}
$$

Similarly, by the definition of the threshold decomposition, $T_0^p(n)=1$ implies that $t_0^q(n)=1$ for $1 \leq q \leq p$ and $1 \leq n \leq L$. Therefore, the number of ones in the window cannot decrease when $t_0^p(n)$ is replaced with $t_0^q(n)$ in Equation (15). This leads to $$
\begin{aligned}
1 &= \text{median } \{X_r^q(m-N), \ldots, X_r^q(m-1), \\
&\quad t_0^q(m), \ldots, t_0^q(m+N)\} \\
&= X_r^q(m)
\end{aligned}
$$

for $1 \leq q \leq p$. Summarizing, Property 2.r holds at position m whenever it holds for positions one through $m-1$. But, as was noted at the beginning of the proof, Property 2.r always holds at position one of the signal. By induction on m, the proof of Property 2.r is complete.

Property 3.r: If the first $m-1$ positions of the signal can be successfully decomposed and reconstructed for a recursive median filter, then $X_r^i(n)=1$ and only if $y_r(n) \geq i$, $1 \leq n \leq m-1$. That is, if $\tag{16}$ $$
\begin{aligned}
y_r(n) &= f\{X_r^i(n), 1 \leq i \leq k-1\} \\
&= \sum_{i=1}^{k-1} X_r^i(n)
\end{aligned}
$$

for all n such that $1 \leq n \leq m-1$ where m is any fixed integer from two to the signal length L, then $X_r^i(n)=1$ if and only if $y_r(n) \leq i$, $1 \leq n \leq m-1$.

Proof: Thresholding the recursively filtered values $y_r(n)$ for $1 \leq n \leq m-1$ gives, for each i, a sequence $t_r^8(n)$, where $$
t_r^i(n) = \begin{cases} 1, & \text{if } y_r(n) \geq i \\ 0, & \text{otherwise} \end{cases} \tag{17}
$$

Using the assumptions of this property given in Equation (16), $$
t_r^i(n) = \begin{cases} 1, & \text{if } \sum_{q=1}^{k-1} X_r^q(n) \geq i \\ 0, & \text{otherwise} \end{cases}
$$

Involing Property 2.r, the previous equation reduces to $$
t_r^i(n) = \begin{cases} 1, & \text{if } X_r^i(n) = 1 \\ 0, & \text{otherwise} \end{cases} \tag{18}
$$

Combining Equations (17) and (18), $X_r^i(n)=1$ if and only if $y_r(n) \geq i$, $1 \leq n \leq m-1$.

This result is similar to Lemma 1 for standard median filters. However, it is important to note that it was assumed that the decomposition worked for the first $m-1$ positions.

Property 4.r: If the first $m-1$ positions of the signal can be successfully decomposed and reconstructed for a recursive median filter, then so can the m'th position.

Proof: First, since the same hypothesis is used, any results from the proof of Property 3.r can be used in this proof. Examining the recursively filtered binary sequences at position m $$X_r^i(m) = \tag{19}$$

$\text{median}\{X_r^i(m-N), \ldots, X_r^i(m-1), t_0^i(m), \ldots, t_0^i(m+N)\} =$ $$\begin{cases} 1, & \text{if } \sum_{n=1}^{N} X_r^i(m-n) + \sum_{n=0}^{N} t_0^i(m+n) \geq N+1 \\ 0, & \text{if } \sum_{n=1}^{N} X_r^i(m-n) + \sum_{n=0}^{N} t_0^i(m+n) < N+1 \end{cases} =$$

$$I\left\{ \sum_{n=1}^{N} X_r^i(m-n) + \sum_{n=0}^{N} t_0^i(m+n) \geq N+1 \right\} =$$

$$I\left\{ \sum_{n=1}^{N} X_r^i(m-n) \geq N+1 - \sum_{n=0}^{N} t_0^i(m+n) \right\} =$$

$$I\left\{ \text{At least } N+1 - \sum_{n=0}^{N} t_0^i(m+n) \text{ elements in} \right.$$

$$\left. X_r^i(m-N), \ldots, X_r^i(m-1) \text{ equal one} \right\}$$

Using Property 3.r, the filtered threshold values in the argument of the indicator function can be changed to the filtered values of the original signal denoted by the $y_r$'s.

$$X_r^i = I\left\{ \text{At least } N+1 - \sum_{n=0}^{N} t_0^i(m+n) \text{ elements in} \right. \tag{20}$$

$$\left. y_r(m-N), \ldots, y_r(m-1) \text{ are } \geq i \right\}$$

The analysis of the filtered version of the original signal follows:

$$y_r(m) = \tag{21}$$

$$\text{median } \{y_r(m-N), \ldots, y_r(m-1), a(m), \ldots, a(m+N)\} =$$

$$\max \{0, i: \text{At least } N + 1 \text{ of } y_r(m-N), \ldots, a(m+N) \text{ are } \geq i\}$$

Using the threshold decomposition, the number of a(m), ..., a(m+N) which are greater than or equal to i is given by $$\sum_{n=0}^{N} t_0{}^i(m + n).$$

Therefore, $$y_r(m) =$$

$$\max \left\{ 0, i: \text{At least } N + 1 - \sum_{n=0}^{N} t_0{}^i(m + n) \text{ elements in} \right.$$

$$\left. y_r(m - N), \ldots, y_r(m - 1) \text{ are } \geq i \right\}$$

$$y_r(m) = \tag{22}$$

$$\max \left\{ 0, i: I \left( \text{At least } N + 1 - \sum_{n=0}^{N} t_0{}^i(m + n) \text{ elements in} \right.\right.$$

$$\left.\left. y_r(m - N), \ldots, y_r(m - 1) \text{ are } \geq i \right) = 1 \right\}$$

and by Equation 20.

$$y_r(m) = \max\{0, i: X_r{}^i(m) = 1\}$$

Using Property 2.r, this converts to a sum $$y_r(m) = \sum_{i=1}^{k-1} X_r{}^i(m)$$

$$= f\{X_r{}^i(m), 1 \leq i \leq k - 1\}$$

Property 4.r states that if the threshold decomposition and reconstruction works for the first m−1 positions of the signal, then it works for the m'th position. By Property 1.r, the function f(.) always works for recursive filters at position one of the signal. Therefore, the combination of these two properties provides an inductive proof that the threshold decomposition technique using recursive filters works at any position of the signal.

Since recursive median filters converge (that is, provide root signals) in one pass, the algorithm introduced in the preceding theorem has many practical advantages over the algorithm using the standard median filter. A simple parallel architecture with one binary recursive median filter preceded by a threshold device may be used for each level.

A simple modification of the proofs of Theorems 1, 2 and 3 shows that the same results hold if any n'th ranked order operation is substituted for the median operation. Thus, fast implementations and analytically useful decompositions exist for these filters as well.

This theorem is also a simple consequence of a much more general theorem. The general theorem demonstrates that the decomposition and superposition properties of thresholding are valid for general multidimensional ranked order operators. Its proof will be discussed below. Because the threshold decomposition and the superposition are inverses, recursive filters can be represented as cascades of simpler filters.

Filters in which the output rank parameter r can change as the window slides across the signal are said to have an adaptive rank parameter; when the window is centered on the m'th position in the input signal, the output rank is r(m). In other words, the rank parameter r is a sequence r(m), $1 \leq m \leq L$.

So that the results will hold for multidimensional input signals, the window shape is allowed to change with position. When the filter output position is m, $1 \leq m \leq L$, let w(m) denote the set of positions which are to be considered in the window. This technique for representing higher dimensions with pointers of a single dimension is demonstrated by examples discussed below.

For convenience, let N(m) be the window size of the filter when it is at position m; that is, the number of positions included in the window w(m). Let the m'th output of this position dependent window shape and ranked order filter applied to an input signal a(m), $1 \leq m \leq L$, be denoted by $\phi_w{}^r(a,m)$. Then, by definition $$\phi_w{}^r(a,m) = \text{the } r(m)\text{th largest element of } \{a(p): p \in w(m)\} \tag{23}$$

To provide a concrete example of the use of the parameters N(m), r(m) and w(m) in the definition of a filtering operation, consider the standard medium filter. A standard median filter has a constant window size of N(m) equal to 2n+1, where n is any fixed integer. Its output rank parameter does not vary with position, so that r(m)=n+1. The definition of the window sequence w(m) would be straightforward, 2n+1 consecutive points centered about the current window position m, if it were not for the start up and end effects associated with finite length signals. To account for the start up effects, the first point is repeated n times at the beginning of the signal so that a symmetric window is defined for each of the first n points in the signal. A similar procedure is followed at the end of the signal, the last point is being repeated n times. In order to account for these end effects, w(m) can be defined as $$w(m) = \begin{cases} (1, \ldots, 1, 2, \ldots, m, \ldots, m + n) & , \text{if } 1 \leq m \leq n \\ (m - n, \ldots, m, \ldots, m + n) & , \text{if } n < m < L - n \\ (m - n, \ldots, m, \ldots, L - 1, L, \ldots, L) & , \text{if } L - n \leq m \leq L \end{cases} \tag{24}$$

Any standard median filter can be described using the window shape sequence of Equation (24). This can be generalized to standard ranked filters by changing the output rank parameter r(m) to any constant r, $1 \leq r \leq 2n+1$.

This notation defines a very general class of ranked order filters. For instance, multidimensional ranked filters with any shape window are in this class. This includes the square and cross window median filters used for image processing. By using a combination of two filters applied in series, separable ranked filters can also be described.

Implementation of these and other filters is now discussed. Assume that the input signal is a discrete sequence of length L which takes on the value a(m) at position m, $1 \leq m \leq L$, and that for each m, a(m) is quantized to one of the k integer values $0, 1, \ldots, k-1$. Let $\phi_w^r(a,m)$ be the output at position m of a rank r(m) and window shape w(m) filter applied to the input sequence a(m). The window shape is allowed to change with position. The results of the following analysis are therefore valid in multidimensional applications. For convenience, let N(m) denote the number of positions in the window w(m). The filter at position m can be written as $$\phi_w^r(a,m) = \text{the } r(m)\text{th largest element of } \{a(p): p \in w(m)\} \quad (25)$$

The threshold decomposition of the original signal at position m is defined to be the set of binary sequences $$t_0^i(m) = \begin{cases} 1, & \text{if } a(m) \geq i \\ 0, & \text{if } a(m) < i \end{cases} \quad (26)$$

with $1 \leq m \leq L$ and $1 \leq i \leq k-1$. Applying the ranked filter to these thresholded values gives another set of binary sequences $$\phi_w^r(t_0^i,m) = \text{the } r(m) \text{ the largest element of } \{t_0^i(p): p \in w(m)\} \quad (27)$$

The following discussion is devoted to the development of three properties of filters with position dependent window shapes and ranks. These three properties lead directly to a superposition principle for generalized rank filters.

In the following proofs, it is often convenient to use the indicator function of the event A, which is given by $$I(A) = \begin{cases} 1, & \text{if } A \text{ is true} \\ 0, & \text{if } A \text{ is false} \end{cases}$$

The following property, although easily shown, allows the filtered binary sequences to be specified at all threshold levels by knowing the highest threshold level at which a 1 occurs.

Property 2: If $\phi_w^r(t_0^i, m) = 1$, then, $\phi_w^r(t_0^1, m) = 1$, $1 \leq q \leq i$.

That is, if the filtered threshold value is one at level i, then it is one for all levels less than i.

Proof: For any fixed i, $1 \leq i \leq k-1$, $$\phi_w^r(t_0^i,m) = \text{the } r(m)\text{th largest element of } \{t_0^i(p): n \in w(m)\} = \quad (28)$$

$$= \begin{cases} 1, & \text{if at least } N(m) + 1 - r(m) \text{ of } (t_0^i(p): n \in w(m)) \text{ equal one} \\ 0, & \text{if at least } r(m) \text{ of } (t_0^i(p): n \in w(m)) \text{ equal zero} \end{cases}$$

$$= I\{\text{at least } N(m) + 1 - r(m) \text{ of } (t_0^i(p): n \in w(m)) \text{ equal one}\}$$

Which by the definition of threshold decomposition becomes = (29)

$$I\{\text{at least } N(m) + 1 - r(m) \text{ of } (a(p): p \in w(m)) \text{ are } \geq i\}$$

By Equation (29), if $$1 = \phi_w^r(t_0^i, m)$$

then $$1 = I\{\text{at least } N(m) + 1 - r(m) \text{ of } (a(p): p \in w(m)) \text{ are } \geq i\}$$

which implies for any q less than or equal to i $$1 = I\{\text{at least } N(m) + 1 - r(m) \text{ of } (a(p): p \in w(m)) \text{ are } \geq q\}$$

$$= \phi_w^r(t_0^q, m)$$

which ends the proof of Property 2.

The relation of the binary valued, ranked order filtered threshold sequences to the output of the filter applied to original k-level signal is provided by Property 3.

Property 3: There exists a mapping f(.) from the set of filtered threshold decomposed sequences $\phi_w^r(t_0^i,m)$, $1 \leq i \leq k-1$ to the signal space of k-leveled signals such that $\phi_w^r(a,m) = f(\phi_w^r(t_0^i,m), 1 \leq i \leq k-1)$.

Proof by construction:

$$\phi_w^r(a,m) = \text{the } r(m)\text{th largest element of } \{a(p): p \in w(m)\} \quad (30)$$

$$= \max\{0, i: \text{At least } N(m) + 1 - r(m) \text{ of } (a(p): p \in w(m)) \text{ are } \geq i\}$$

$$= \max\{0, i: I(\text{At least } N(m) + 1 - r(m) \text{ of } (a(p): p \in w(m)) \text{ are } \geq i) = 1\}$$

Combining Equations (29) and (30)

$$\phi_w^r(a,m) = \max\{0, i: \phi_w^r(t_0^i m) = 1\}$$

which by the Property 2 implies $$\phi_w^r(a,m) = \sum_{i=1}^{k-1} \phi_w^r(t_0^i,m) \quad (31)$$

$$= f(\phi_w^r(t_0^i,m), 1 \leq i \leq k-1)$$

Any rank value can be obtained by summing the corresponding threshold decomposed rank values over all possible threshold levels. In loose terms, the function f(.) stacks the binary signals $\phi_w^r(t_0^i, m)$ on top of one another starting with $i=1$. The value of the output at position m is then the highest level at position m in the stack at which a one appears.

The function f(.) constructed above is shown to be the inverse of the threshold decomposition by Property 4.

Property 4: The binary sequences $t_1^i(m)$, $1 \leq m \leq L$, and $1 \leq i \leq k-1$, obtained by thresholding $\phi_w^r(a,m)$, $1 \leq m \leq L$, are identical to the filtered threshold values of the original signal $\phi_w{}^r(t_0{}^i,m)$, $1\leq m \leq L$, and $1\leq i \leq k-1$ (see Property 3).

Proof:

$$t_1{}^i(m) = \begin{cases} 1, & \text{if } \phi_w{}^r(a, m) \geq i \\ 0, & \text{if } \phi_w{}^r(a, m) < i \end{cases}$$

Using Equation (18) from the proof of Property 2, $$t_1{}^i(m) = \begin{cases} 1, & \text{if } \sum_{i=1}^{k-1} t_0{}^i(m) \geq i \\ 0, & \text{otherwise} \end{cases}$$

by Property 2

$$t_1{}^i(m) = \begin{cases} 1, & \text{if } t_0{}^i(m) = 1 \\ 0, & \text{otherwise} \end{cases}$$

$$= t_0{}^i(m)$$

The above results show that one pass of a generalized rank order filter over the input signal is equivalent to first thresholding the signal, filtering each threshold sequence, and reconstructing the output using the function f(.). This operation can clearly be repeated for a series of generalized ranked filters. A simple inductive argument based on the fact that f(.) and the decomposition are inverse operations between the binary and k level signals shows that the intermediate reconstructions can be omitted. These results are summarized in Theorem 4.

Theorem 4:

The output of a series of ranked order filters with position dependent window shapes applied to a k-level input signal is identical to the superposition, using the function f(.), of the filtered threshold decomposition of the input signal.

This result provides a new tool for both the implementation and the analysis of the ranked order filtering operations applied to arbitrary level signals. Two important applications of this result are the simple representation of recursive ranked operators and separable image processing algorithms as cascades of $\phi$ filters. A separable image processing algorithm is one in which processing is done row by row and then column by column.

The discussion which follows demonstrates how several different filters can be put into the form of ranked order operators with position dependent window shapes and ranks. To illustrate this principle, recursive median filters and separable median filters for images are discussed in detail. By Theorem 4, any filter which has a general ranked order filter representation can be implemented or analyzed using the threshold decomposition technique.

As discussed above, the threshold decomposition technique is valid for recursive median filters. However, using the results of the previous section, an alternate proof is presented by showing that recursive median filters are included in the class of ranked order operators with position dependent window shapes. To do this, a bank of filters is needed. Each filter in the bank is a median filter. That is, it calculates the median of the values that are specified to be in the window. The window, however, changes shape with position and is also different for each filter. Let $w^t(m)$ be the set of positions in the window at position m of the signal for filter t in the bank of filters, $1\leq m \leq L$ and $1\leq t \leq L$. These filters are applied sequentially to the entire input signal where $t=1$ is the first and $t=L$ is the final filter in the bank. The following definition of these windows results in a bank of filters whose combined effect is equivalent to a recursive median filter of window width $2n+1$.

$w^t(m) =$ $$\begin{cases} (1,\ldots,1,2,\ldots,m,\ldots,m+n), & \text{if } 1 \leq m = t \leq n \\ (m-n,\ldots,m,\ldots,m+n), & \text{if } n < m = t < L - n \\ (m-n,\ldots,m,\ldots,L-1,L,\ldots,L), & \text{if } L - n \leq m = t \leq L \\ (m), & \text{if } m \neq t \end{cases}$$

Essentially, the signal is passed unless $m=t$. For the case $m=t$, the median of the nearest $2n+1$ points is calculated. Beause of the preceding filters in the bank, the n points with indices less than m are computed medians. This bank of filters shows that recursive median filters have the threshold decomposition property. By Equation 27 or by the results discussed previously, the intermediate reconstructions can be eliminated and the recursive filter can be implemented directly on the binary threshold sequences.

Another popular median-type filter is the separable filter used for image processing. This filter is actually a combination of several filters. Suppose an image has M rows and L columns, and is represented by the sequence a(i,j), $1\leq i \leq L$ and $1\leq j \leq M$. With a separable filter, each row is median filtered as a separate signal and the output is then filtered column by column in the same manner. This can be represented as a sequence of median filters with a constant window width $2n+1$ but with position dependent window shapes $w^t(m)$, $1\leq t \leq 2L$, where $w^t(m)$ equals

| | |
|---|---|
| $[(t,1),\ldots,(t,1),(t,2),\ldots,(t,m),\ldots,(t,m+n)]$ | if $t \leq L$; $1 \leq m \leq n$ |
| $[(t,m-n),\ldots,(t,m),\ldots,(t,m+n)]$ | if $t \leq L$; $n > m \leq L - n$ |
| $[(t,m-n),\ldots,(t,m),\ldots,(t,L-1),(t,L),\ldots,(t,L)]$ | if $t \leq L$; $L - n \leq m \leq L$ |
| $[(1,t-L),\ldots,(1,t-L),(2,t-L),\ldots,(m+n,t-L)]$ | if $t > L$; $1 \leq m \leq n$ |
| $[(m-n,t-L),\ldots,(m,t-L),\ldots,(m+n,t-L)]$ | if $t > L$; $n \leq m \leq L - n$ |
| $[(m-n,t-L),\ldots,(L-1,t-L),(L,t-L),\ldots,(L,t-L)]$ | if $t > L$; $L - n \leq m \leq L$ |

Just as two dimensions were used in the above example, the position dependent window shape allows for the implementation of ranked order filters in arbitrary dimensions.

The threshold decomposition has now been shown to hold for arbitrary dimensioned ranked order operators with position dependent window shapes and adaptive ranks. One ranked type filter not included in this class is the alpha trimmed filter. The special superposition property is shown by the discussion below to hold for weighted rank filters. The alpha trimmed filter is used as an example for this class of filters.

For ranked order filtering, the output is a value in the window as determined by its associated rank among the other values. A generalization of this concept is to average a weighted combination of the ranked values in the window. A weight is associated with each ranked value in the window w(m). The filter output y(m) is defined by $$y(m) = \sum_{j=1}^{N(m)} h_j \cdot \phi_w{}^j(a,m) \qquad (32)$$

$$= \sum_{j=1}^{N(m)} h_j \cdot \text{the } j\text{'th largest element } \{a(p), p \in w(m)\}$$

The only restriction placed on the weights $h_j$ is that they be finite. Obviously the ranked order or $\phi$ filter is a special case where $h_j$ is 1 for equal to the rank r(m) and 0 otherwise. The following reconstruction principle for weighted rank filters is shown directly by Theorem 5.

Theorem 5:

One pass of a weighted rank filter with a position dependent window shape is equivalent to the f(.) reconstruction of the filtered threshold decomposed sequences.

Proof: As before, let a(m), $1 \leq m \leq L$, be the input signal and let $t_0{}^i(m)$ be the threshold decomposition of the input signal. Applying the reconstruction function to the filtered threshold decomposed sequences yields, for any fixed m, $$f\left\{ \sum_{j=1}^{N(m)} h_j \cdot \phi_w{}^j(t_0{}^i,m) \right\} = \sum_{i=1}^{k-1}\left\{ \sum_{j=1}^{N(m)} h_j \cdot \phi_w{}^j(t_0{}^i,m) \right\} \qquad (33)$$

$$= \sum_{j=1}^{N(m)} h_j \left( \sum_{i=1}^{k-1} \phi_w{}^j(t_0{}^i,m) \right)$$

by Property 3

$$f\left\{ \sum_{j=1}^{N(m)} h_j \cdot \phi_w{}^j(t_0{}^i,m) \right\} = \sum_{j=1}^{N(m)} h_j \phi_w{}^j(a,m) \qquad (34)$$

$$= y(m) \qquad (35)$$

Using the threshold decomposition for cascaded weighted fillers may not be efficient since the advantage of decomposition is that it leaves binary signals for the majority of the operations. With weighted filters operating on binary filters, a binary output is not guaranteed. Because of the increasing number of possible levels, there is no equivalence between the filtered threshold decomposed signals and the binary threshold decomposed filtered signals. That is, the function f(.) and the decomposition are not inverses whenever the filter creates a level which is not one of the original levels chosen for thresholding.

The result contained in Theorem 5 is still of interest, though, since it allows the threshold decomposition to be used on filters which are cascades of rank filters followed by a single weighted rank filter. This greatly simplifies the implementation of these filters, which are essentially nonlinear edge preserving, impulse suppressing filters followed by a type of linear smoother.

Trimmed filters, of which alpha trimmed mean filters are a subset, are an implementation of the intuitive notion that statistical outliers should not be used in computations. In each window position, the samples are ranked and a specified number of the smallest and largest values are eliminated from consideration before a statistic is calculated. In this case, the statistic being estimated is the mean. By demonstrating that alpha trimmed mean filters are members of the class of weighted ranked order operations discussed previously, the threshold decomposition technique can be used for their analysis and implementation.

Let $y_\alpha(m)$ be the output of an alpha trimmed mean filter at position m, $1 \leq m \leq L$. Then by definition, $$y_\alpha(m) = \sum_{j=1}^{N(m)} h_j \cdot \phi_w{}^j(a,m)$$

where $$h_j = \begin{cases} \frac{1}{(N(m) - 2\alpha)}, & \text{if } \alpha < j < N(m) - \alpha \\ 0, & \text{if } j \leq \alpha \text{ or } j \geq N(m) - \alpha \end{cases}$$

Because the number of small samples and large samples which were removed from the calculation are equal, this filtering technique is known as symmetric alpha trimming. This technique is purported to give a more stable estimate of the mean than a direct average.

The threshold decomposition and the set of binary signals perform the same function for ranked order filters that superposition and sinusoids perform for linear filters —they allow complex problems to be decomposed into simpler problems. This have very fortunate practical and theoretical consequences.

On the practical side, the decomposition has an important impact on the implementation of ranked order filters. It shows that a ranked order filter for a multi-level signal is simply a parallel connection of filters for binary signals. Furthermore, since the output of the ranked filter for a binary signal is found by counting the number of ones in the window and comparing the result to a threshold, these filters can be implemented in a more straightforward manner than prior art filters since complicated sorting and ranking is no longer needed.

On the theoretical side, the decomposition shows that the analysis of the ranked order filter's effect on multi-level signals is reduced to the much simpler analysis of binary signals. It is now clear that any of the properties of these filters which were limited to binary signals can now be extended in a straightforward fashion to multi-level signals. Also, the difficult task of comparing different ranked order operators is now reduced to the binary signal domain.

These theoretical results should improve understanding of the behavior of these filters. The practical results should lead to the use of these filters in many new real time signal processing applications, particularly real time image processing.

The threshold decomposition technique discussed above allows any ranked order filter to be implemented as a parallel connection of binary ranked order filters. Although this technique is not an effective software algorithm for a multi-purpose computer, the parallelism of the algorithm and the simplicity of each of the parallel sections is amenable to VLSI implementation. Because the actual filtering is done at the binary signal level, this design is extremely fast and versatile. In addition, the actual layout can be modified in a straight forward manner to allow hardware implmentation of a broad class of ranked filters.

Several fast algorithms exist for the implementation of median filters on multi-purpose digital computers. For example, there are those described in G. A. Arce and N. C. Gallagher, Jr., "State Description for the Root-Signal Set of Median Filters," *IEEE Trans. Acoust., Speech, and Signal Processing*, Vol. ASSP-30, pp. 894–902, December 1982; E. Ataman, V. K. Aatre, and K. M. Wong, "A Fast Method for Real-Time Median Filtering," *IEEE Trans. Acoust., Speech, and Signal Processing*, Vol. ASSP-28, pp. 415–420, August 1980; and T. S. Huang, G. T. Yang, and G. Y. Tang, "A Fast Two-Dimensional Median Filtering Algorithm," *IEEE Trans. Acoust., Speech, and Signal Processing*, Vol. ASSP-27, pp. 13–18, February 1979.

Figure 11:
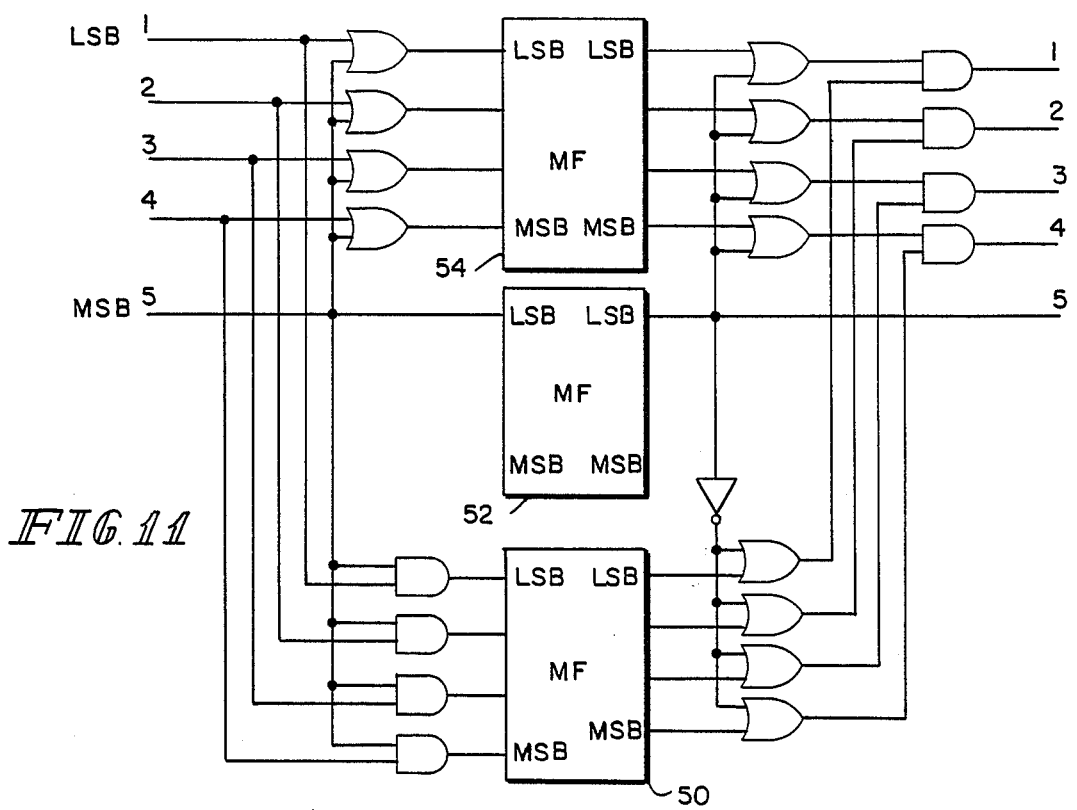
FIG. 11 illustrates a block diagram of a circuit for a binary median filter with extended word size.

For example, in Ataman, et al, speed is obtained by doing so much of the ranking as possible on individual bits of the input words. The Ataman, et al algorithm is, in fact, a special application of the threshold decomposition technique. The signal is partitioned only at the levels between bits instead of at all levels. The results are "glued" together by recombining these bit by bit operations into a complete word. A similar recombination technique by interconnecting filter chips is discussed later with reference to FIG. 11.

Using the same notation as above, an input sequence $\{a(m)\}$ is mapped to an output sequence $\{y(m)\}$ by a window width $2n+1$ median filter when $$y(m) = \text{median}\{a(m-n), \ldots, a(m), \ldots, a(m+n)\}$$

The brute force implementation is to rank the values at each position of the window and select the median value as the filter output. Because the window sequentially slides across the input sequence, a significant reduction in computation is obtained by inserting the next input value into the already ranked set of values from the previous window and dropping the value which has shifted to a position outside the window. This means that, after initialization of the pointers for the first window position, only one value need be ordered at each of the window positions. Whenever the input signal takes on some set of values which is known before processing, say the k integers 0 to $k-1$, the algorithm can be made even faster by using bin sorts. Because these techniques maintain a set of pointers to the ranked values, they are known as histogram algorithms.

As can be seen from the preceding discussion, the threshold decomposition is useful in analyzing fast ranked filtering techniques. Because of the large number of binary sequences necessary to represent the input signal, the threshold decomposition algorithm is not recommended for software implementation on a multipurpose computer. For example, eight bits would require 255 binary median filter sequences. The benefits of having this large number of binary filters operating simultaneously is realized in hardware, however, where this translates to a parallel and very fast design. Past hardware ranking implementations were based on compare and swap algorithms such as those discussed in K. Oflazer, "Design and Implementation of a Single Chip 1-D Median Filter," *IEEE Trans. Acoust., Speech and Signal Proc.*, Vol. ASSP-31, pp. 1342–1349, December 1983. This new technique eliminates the ranking operation from the implementation of the filter. The resulting design is more versatile and allows a significant savings in time when modifications to the filtering operation are needed. This, of course, translates, into an enormous reduction in the cost of fabricating other chips for ranked order operations.

A discussion of the implementation of threshold decomposition filtering follows. Let the input signal be $\{a(m)\}$, taking on the values of the k integers from 0 to $k-1$. The output of a window width $2n+1$ median filter applied to $\{a(m)\}$ is denoted by $\{y(m)\}$. Finally, the threshold decomposition of the input signal into binary sequences is given by $$t^i(m) = \begin{cases} 1, & \text{if } a(m) \geq i \\ 0, & \text{otherwise} \end{cases}$$

FIG. 6 shows a block diagram of the filtering system of this invention. Input signal sequence 26 is decomposed into a set of binary sequences by threshold operation 28. Each binary sequence is filtered individually, illustratively by binary median filters 30. The binary signal sequences which result from the binary median filtering are combined at summer 32 to produce a multilevel filter output 34.

Figure 22:
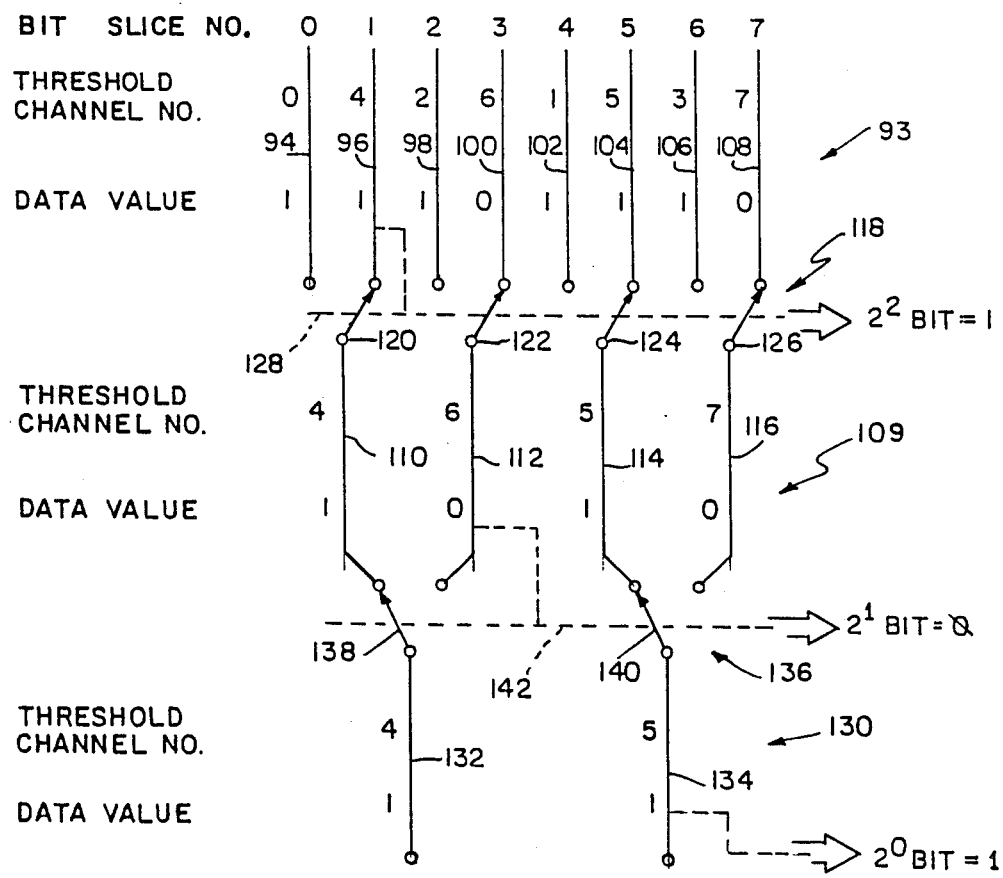
FIG. 22 illustrates a flow diagram of a reconstruction circuit.

The decomposition and superposition operations are easier to implement than they appear. For instance, the superposition need not be a full adder. This reduction in complexity is accomplished by correctly arranging the bit slices so that all the slices necessary to calculate specific output bits are grouped together. An example of a reduced complexity means for implementing the reconstruction section is shown in FIG. 22 and will be discussed later. The circuit represented by FIG. 22 essentially performs a binary search of the outputs of the binary ranked order filters to determine the position of the highest level which is a "1."

The remaining part of the algorithm is the binary median filter. Let $$x(m) = \text{median } \{t^i(m-n), \ldots, t^i(m+n)\} \quad (36)$$

be the binary output of a window width $2n+1$ median filter applied to the level i threshold sequence. Because these are binary values, the median can be rewritten using the indicator function $I(.)$.

$$\begin{aligned} x(m) &= I\,[\text{median}\{t^i(m-n), \ldots, t^i(m+n)\} = 1] \\ &= I\,[\text{At least } n+1 \text{ of } t^i\text{'s equal } 1] \\ &= I\left[\sum_{p=-n}^{n} a(m+p) \geq n+1\right] \end{aligned}$$

This means the binary median filter can be implemented with an adder and a comparator. A ranking algorithm is not necessary. A system diagram of this adding circuit can be seen in FIG. 7.

Referring to FIG. 7, a binary median filter 300 includes one-bit delay elements 302, cummulative adder 304 and comparator 306. Delay elements 302 will be sequentially connected to each other and the number of delay elements 302 included in filter 300 will be equal to the window width of filter 300. The first delay element 302 will have an input connected to an input of filter 300 and the last delay element 302 has an output coupled to a "subtract" input of adder 304. Adder 304 also has an add input coupled to the input of filter 300. Adder 304 has an output coupled to an input of comparator 306 which provides a signal indicative of the cummulative count of adder 304. Comparator 306 has an output at which binary output signal y(m) is developed.

In operation, an input signal a(m+n) is applied to the input of the first delay element 302 and to the "add" input of adder 304. Adder 304 will cummulatively total the number of "1" bits in the input signal and will provide at its output a signal indicative of its cummulative total. Comparator 306 will compare the cummulative total from adder 304 to n+1 (where 2n+1 is the window width) and will set y(m) equal to 1 if adder 304's cummulative total is greater than or equal to n+1. Otherwise, y(m) will be set to zero.

The output signal from the last delay element 302 is applied to the "subtract" input of adder 304. Each time a "1" bit is output from the last delay element 302, the cummulative total of adder 304 will be decreased by one. Thus, the cummulative total of adder 304 is always equal to the number of "1" bits in the current window.

Figure 8:
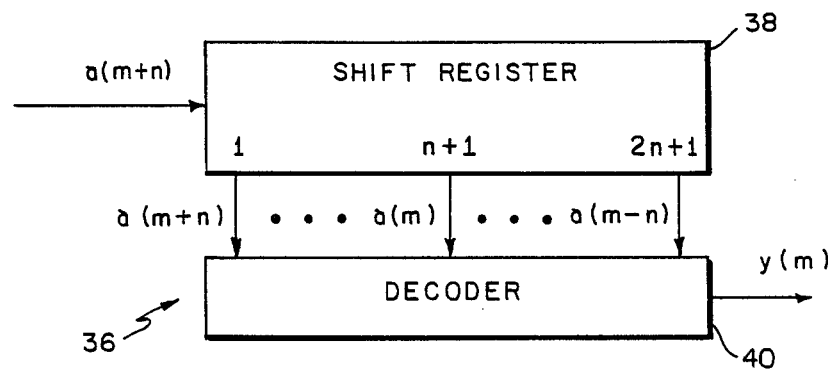
FIG. 8 illustrates a block diagram of a circuit for a binary median filter.

This design is easily modified for different window widths, that is, different n. FIG. 8 shows a circuit configuration for the binary median filter which is more readily implemented by very large scale integration (VLSI) techniques. Binary median filter 36 comprises a shift register 38 having its outputs coupled to a decoder 40. Shift register 38 can store, 2n+1 bits (the window width) and has an output corresponding to each bit. As a binary sequence is shifted through shift register 38, the decoder 40 will decode the bit patterns at the outputs of shift register 38 and will produce a "1" for output y(m) whenever there are at least n+1 "1" bits in the window held in shift register 38.

A simple modification to a 2n+1 median filter will enable it to do 2n−1, or smaller, median filtering as well. Let z(m) be the output of a window width 2n−1 binary median filter. Then $$z(m) = I\left\{ \sum_{p=-(n-1)}^{(n-1)} t^i(m+p) \geq n \right\} \quad (37)$$
$$= I\left\{ \sum_{p=-(n-1)}^{(n-1)} t^i(m+p) + 0 + 1 \geq n+1 \right\}$$

which is a window width 2n+1 median filter with one value in the window fixed at 1 and another value fixed at 0.

Figure 9:
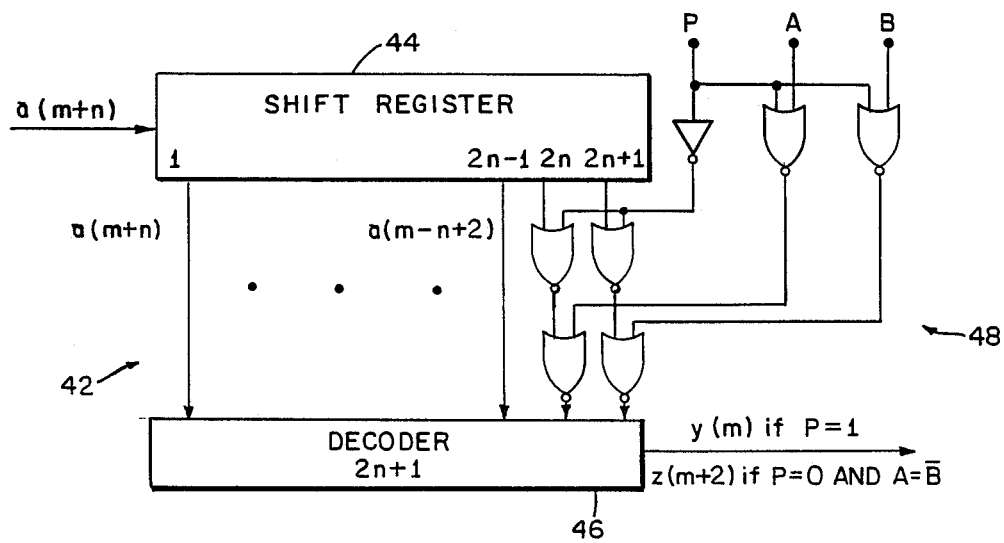
FIG. 9 illustrates a block diagram of a circuit for a binary median filter with multiple window widths.

FIG. 9 shows a circuit which permits the window width of a binary medium filter to be selected from a plurality of window widths. Binary median filter 42 includes shift regiser 44 and decoder 46. Shift register 44 illustratively has 2n+1 outputs which comprise the maximum possible window width which can be selected. Decoder 46 has 2n+1 inputs. A logic network 48 illustratively couples outputs 2n and 2n+1 of shift register 44 to corresponding inputs of decoder 46. The dots indicate that logic networks identical to logic network 48 couple corresponding outputs of shift register 44 to appropriate inputs of decoder 46. By strapping the appropriate "A" and "B" pins of each logic network, any window width smaller than 2n+1 can be selected. Illustratively, setting P=1, A=0, and B=1 (or A=1 and B=0) will cause the circuitry shown in FIG. 9 to function as a window width 2n−1 median filter instead of a window width 2n+1 median filter.

With a slight modification to the circuit of FIG. 9, certain ranked filters which are not medians can also be obtained using the same median decoder by setting the values A and B asymmetrically to 0 or 1. This can be accomplished by using pin inputs and having the window width control pins turn latches to these inputs on and off. Illustratively assuming the circuitry of FIG. 9 represents a window width 5 median filter, a window width 3 maximum filter (ranked order output r=3) can be obtained by setting P=1 and A=B=1 and otherwise leaving the decoder 46 unchanged.

The same results can be obtained by externally modifying the input sequence to the median filter chip. For example, the sequence $$t^i(1), 0, 1, t^1(2), \ldots, t^i(2n), 0, 1, t^i(2n+1), \ldots \quad (38)$$

as an input to a window width 2n+1 median filter would produce a coded version of the window width 2n−1 median filter. Using the previous notation, the output sequence would be $$z(1), G, G, z(2), \ldots, z(2n), G, G, z(2n+1), \ldots$$

where G denotes the garbage bits to be thrown away. When multiple passes are performed, the garbage bits must be replaced after each pass with the 0, 1 configuration of Equation (38). With multi-level signals, the 0's and 1's would become the minimum and maximum allowed values, respectively. The hardware implementation is obviously better because it requires no external modification to the input sequence. In fact, the user cannot tell that the same decoder is being used for both filters.

Many applications of median filters require repeated filter passes. Frequently the signal is filtered until it is invariant to additional passes of the filter, i.e., a root. From the previous discussion, the threshold decomposition and its associated reconstruction function are inverses, that is, there can be repeated filter passes at the binary level. In terms of the design of a chip implementing threshold decomposition filtering, all that is required is repeated median filter stages at the binary level. It remains an extremely parallel and fast design.

Figure 10:
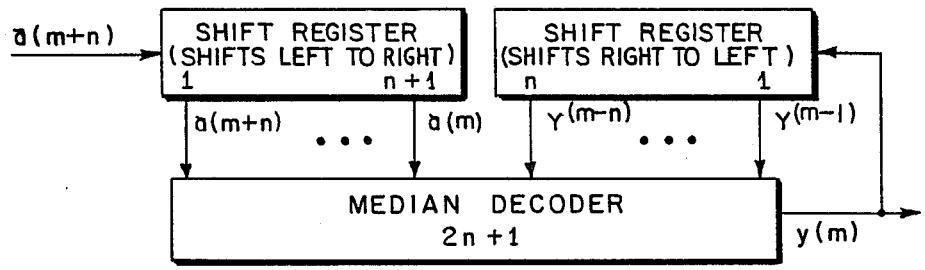
FIG. 10 illustrates a block diagram of a circuit for a binary recursive median filter.

In the past, recursive median filters were used because they filter any input signal to a root signal after only one pass of the filter. It is worth noting that the recursive filter, because the threshold property holds, can be implemented using a design technique similar to the one just described for the standard median filter. FIG. 10 demonstrates the necessary modifications to the binary filtering levels when implementing the recursive filter.

With a simple binary median decoder, many window width median filters and several different ranked filters can be pin programmed. The design, because of its parallelism, is easily modified. Another advantage is an increase in speed accomplished by doing repeated filter passes at the binary level before reconstruction. Further, the threshold decomposition can be combined with an analog to digital (A/D) converter. This provides an increase in speed because many A/D's use a type of threshold counter with a comparator to do the digital conversion.

A problem in the design of a chip is the number of bits to be used for the input and output data words. Whatever is finally decided, it is certain that there will be some application which requires additional accuracy and consequently larger size data words. In this section, an algorithm for increasing the word size by connecting median filter chips of smaller word size together is presented. This is done for an increase of one bit. Extensions to additional bits are straightforward. In addition, because this technique is another application of threshold decomposition, it is presented with only a brief explanation.

Suppose a four bit median filter chip with the desired window which is available, but the application necessitates a five bit processor. The solution is accomplished using the threshold technique shown in FIG. 11. The input signal is thresholded, using external logic, at the most significant bit (MSB). The first chip, median filter chip 54, is used to filter the lower four bits when the signal is less than $2^5$ and sees $2^5-1$, i.e., all 1's, when the input is not less than $2^5$. The second chip, median filter chip 52, is used to process the four lower bits when the signal is greater than or equal to $2^5$ and sees all zeroes when the input is smaller than this level. Another median filter chip, chip 50, which need only be a binary median filter, is needed to filter the MSB of the input signal. This system maintains the proper order and rank of the input sequence as the values move through the median filter chips. The five bit output is determined by latching onto the appropriate four lower bits as selected by the output of the MSB filter chip 50. When the MSB output is one, the higher threshold chip, 52, carries the correct lower four bits and chip 54 has all ones as its output. When the MSB filter chip 50's output is a zero, the lower threshold chip, 54, carries the correct lower four bits and the chip 52 has all zeros for output. It should be understood that this interconnection of chips 50, 52, 54, as well as the interconnection of any additional filter chips, does not require any feedback between the filter chips. This prevents additional delays from being introduced as additional filter chips are added.

An important practical advantage of the threshold decomposition approach to ranked order filtering is the way it lends itself to a highly regular structural implementation in a silicon gate NMOS process.

Given an N-bit binary code word, the operation of threshold decomposition represents this N-bit code word as $2^N$ one-bit words. Each such one-bit word physically appears within its own "threshold channel." It is convenient to number these binary channels from 0 to $2^N-1$. Threshold channel number $\emptyset$ is retained in the design to facilitate the cascading of several chips, which will be discussed later. If the N-bit input code word represents the numeric value $Q(0 \leq Q \leq 2^N-1)$, then the binary value placed on threshold channel i will be "1" if and only if $Q \geq i$. Otherwise, the threshold channel will receive a "0." Viewing the $2^N$ threshold channels collectively, they could be thought of as representing an element of a bar graph: an individual bar whose height grows and shrinks with time as a stream of N-bit code words undergoes threshold decomposition. The value of the incoming code word can be deduced from the current threshold channel contents by simply finding the location of the "break" between those channels containing a "1" and those holding a "0," in other words, by measuring the height of the "bar." This operation of inferring the applied code word from threshold channel contents is termed "code word reconstruction."

According to threshold decomposition filtering, as described above, passing a $2^N$-level signal through a conventional rank order filter is equivalent to the following:

(1) Threshold decomposing the input signal into a set of $2^N$ binary-valued signals (threshold channels).

(2) Rank order filtering each individual binary channel to produce $2^N$ binary-valued output channels.

(3) Passing the $2^N$ filtered channels through a code word reconstruction operation to produce the N-bit ROF (ranked order filter) output sample.

Discussed herein is an NMOS IC design of a 6-bit rank order filter based upon threshold decomposition digital filtering. The chip provides for programmable window lengths of 3, 5, 7, and 9; the selection of any element in the rank order; operation in the non-recursive or recursive modes; and the ability to function in a "ganged" mode so that two or more identical chips can accommodate samples of length seven or eight bits.

The first operation that must be accomplished in the ROF algorithm is that of decomposing the N-bit input code word into $2^N$ binary input signals which are the inputs to the $2^N$ threshold channels. As mentioned previously, the task is equivalent to a comparison operation between the N-bit input code word and the N-bit threshold channel number. If this comparison shows that the input code word is greater than or equal to the threshold channel number for a given channel, then the threshold channel in question will receive a "1" as its input bit. If, however, the input code word is less than the threshold channel number, the threshold channel will receive a "0" as its input bit. It is important to note that there are $2^N$ threshold channels and that each channel must have its own unique threshold decomposition comparator. Therefore, $2^N$ such comparators are required. Critical factors in the design of the threshold decomposition circuitry are low power consumption, small device count, and minimal area. These considerations must be incorporated since $2^N$ comparators are on the chip and the power, device count, and area can therefore potentially be quite large. Therefore, a technique is used that makes use of a small device count which eventually leads to both a small power dissipation and a small area cost for the threshold decomposition circuitry.

The comparison between the input code word, Q, and the threshold channel number, i, is performed in a bit-slice fashion. Since both Q and i are N bits long, the comparison is done in N stages. The signals between bit slices and a string of N such slices are shown in FIG. 12.

The $D_j$ (Data) line represents the result of the comparison up to stage j. The $L_j$ (Liability) signal is an indicator flag that is passed on from one stage to the next and is set to "0" as soon as the comparison decision has been completed. When the $L_j$ signal is "0", all future stages merely pass the $D_{j-1}$ information through the stages unaffected. The $D_{j-1}$ and $L_{j-1}$ signals are both forced to a "1" at the most significant bit and the decision whether to reset these signals to "0" begins at the left end and proceeds to the right. After N stages of bit-wise comparison, the $D_j$ result produced by the Nth stage of the threshold decomposition comparator is the result that is eventually passed on to the threshold channel to be rank-order filtered.

The operation of the comparator can be demonstrated through the state diagram of FIG. 13. The initial state is the $Q_j=i_j$ state, due to the fact that the inputs to the first stage are both "1's."

By following the "appropriate path" from this state, the outputs of the first stage can be determined. The "appropriate path" is specified by the most significant bits of Q and i. Proceeding in a similar fashion, each pair of Q and i bits will indicate the next path that should be taken. When all of the pairs of Q and i bits have been examined, the $D_j$ value of the final stage is equal to "1" if $Q \geq i$ ir "0" if $Q < i$. This result is the desired output of the threshold decomposition circuitry and is next sent to the threshold channels for rank-order filtering.

The realization of FIG. 13 is accomplished by first deriving the truth table which describes the particular state transitions mentioned previously. This truth table is Table 1.

TABLE 1

| $D_{j-1}$ | $L_{j-1}$ | $Q_j$ | $i_j$ | $D_j$ | $L_j$ |
|---|---|---|---|---|---|
| 0 | 0 | 0 | 0 | 0 | d |
| 0 | 0 | 0 | 1 | 0 | d |
| 0 | 0 | 1 | 0 | 0 | d |
| 0 | 0 | 1 | 1 | 0 | d |
| 0 | 1 | 0 | 0 | 0 | d |
| 0 | 1 | 0 | 1 | 0 | d |
| 0 | 1 | 1 | 0 | 0 | d |
| 0 | 1 | 1 | 1 | 0 | d |
| 1 | 0 | 0 | 0 | 1 | 0 |
| 1 | 0 | 0 | 1 | 1 | 0 |
| 1 | 0 | 1 | 0 | 1 | 0 |
| 1 | 0 | 1 | 1 | 1 | 0 |
| 1 | 1 | 0 | 0 | 1 | 1 |
| 1 | 1 | 0 | 1 | 0 | d |
| 1 | 1 | 1 | 0 | 1 | 0 |
| 1 | 1 | 1 | 1 | 1 | 1 |

The next step is to break this truth table down into two sub-tables. These sub-tables are created by copying all of the rows with $i_j=0$ into one sub-table and those rows with $i_j=1$ into another sub-table. This procedure yields the following results as shown in Tables 2(a) and 2(b).

TABLE 2

| (a) $i_j = 0$ sub-table | | | | | (b) $i_j = 1$ sub-table | | | | |
|---|---|---|---|---|---|---|---|---|---|
| $D_{j-1}$ | $L_{j-1}$ | $Q_j$ | $D_j$ | $L_j$ | $D_{j-1}$ | $L_{j-1}$ | $Q_j$ | $D_j$ | $L_j$ |
| 0 | 0 | 0 | 0 | d | 0 | 0 | 0 | 0 | d |
| 0 | 0 | 1 | 0 | d | 0 | 0 | 1 | 0 | d |
| 0 | 1 | 0 | 0 | d | 0 | 1 | 0 | 0 | d |
| 0 | 1 | 1 | 0 | d | 0 | 1 | 1 | 0 | d |
| 1 | 0 | 0 | 1 | 0 | 1 | 0 | 0 | 1 | 0 |
| 1 | 0 | 1 | 1 | 0 | 1 | 0 | 1 | 1 | 0 |
| 1 | 1 | 0 | 1 | 1 | 1 | 1 | 0 | 0 | d |
| 1 | 1 | 1 | 1 | 0 | 1 | 1 | 1 | 1 | 1 |

The Boolean equations describing the logic outputs of the truth table of Table 2(a) are $$D_j = D_{j-1}$$

$$L_j = L_{j-1}\overline{Q_j}$$

and the Boolean equations describing the logic outputs of the truth table of Table 2(b) are $$D_j = D_{j-1}(Q_j + \overline{L_{j-1}})$$

$$L_j = L_{j-1}$$

On the chip itself, two different logic blocks or cells will be used to generate the desired threshold decomposition comparator output. One cell will be used in those physical locations where $i_j=0$ and the other where $i_j=1$. The cells will be named "type0" and "type1" depending on the logic equations implemented within the particular cell. The "type0" cell will contain the logic necessary to implement the $i_j=0$ sub-table and the "type1" cell will contain the logic for the $i_j=1$ sub-table. The placement of these cells in the layout follows a very regular pattern. The N-bit threshold channel number, when represented in binary notation, indicates which types of cells must be used. For example, in an N=4 bit system with i=5=(0101)$_2$, the most significant cell will be a "type0" cell, followed by a "type1", a "type0", and finally another "type1." There are N cells per threshold channel comparator and $2^N$ channels. Exactly half of the cells are of "type0" and half are "type1." Therefore, there are $N2^{N-1}$ "type0" cells and an equal number of "type1" cells.

FIG. 14(a) shows a schematic for a "type 1" cell and FIG. 14(b) shows a schematic for a "type0" cell. Referring to FIG. 14(a), the "type 1" cell 144 comprises a transmission gate FET 146 and a transmission gate FET 148. The gate electrode of transmission gate 146 is coupled to a (Phi1+$\overline{Q_j}$) logic line where Phi1 refers to a clock signal and $\overline{Q_j}$ is the complement of the j bit of the Q input code word. The circuitry necessary to generate the clock, Phi1, $\overline{Q_j}$ and "OR" Phi1 with $\overline{Q_j}$ is implemented in any conventional manner. "Type1" cell 144 also has a data input $D_{j-1}$, a data output $D_j$, a liability input $L_{j-1}$, and a liability output $L_j$.

Liability input $L_{j-1}$ is connected to liability output $L_j$ and to one side of transmission gate 146. The other side of transmission gate 146 is connected to the gate electrode of transmission gate 148. One side of transmission gate 148 is connected to ground and the other side is connected to the data input $D_{j-1}$ and to the data output $D_j$.

Referring to FIG. 14(b), a "type0" cell 150 has a transmission gate FET 152, a data input $D_{j-1}$, a data output $D_j$, a liability input $L_{j-1}$, and a liability output $L_j$. The liability input $L_{j-1}$ is connected to one side of transmission gate 152 and liability output $L_j$ is connected to the other side of transmission gate 152. The gate electrode of transmission gate 152 is connected to the (Phi1+$\overline{Q_j}$) logic line. It should be understood that $D_j$, $D_{j-1}$, $L_j$, $L_{j-1}$, and (Phi1+$\overline{Q_j}$) are used to indicate that each "type0" and "type1" cell has inputs and output that can be so characterized, and not to indicate that the inputs and outputs to all the cells are identical.

During the first phase of the clock, the (Phi1+$\overline{Q_j}$) lines are at a logic "1", which turns on transmission gates 146 and 152. During the same clock cycle, all points along the liability signal line are brought low which brings all the $L_{j-1}$ inputs to the cells low. During the second clock phase, (Phi1+$\overline{Q_j}$)=$\overline{Q_k}$ is presented to the logic block. The most significant liability input is set to a "1" and the comparison proceeds from the most significant bit to the least significant bit as described before. The data line can only be brought low when a "type1" (i.e., $i_j=1$) transmission circuit is encountered with $Q_j=0$ and $L_{j-1}=1$. Under this condition, the (Phi1+$\overline{Q_j}$) line will be a 1 which biases gate 146 into transmission. Gate 146 then couples the $L_{j-1}$ input, which is 1, to the gate electrode of transmission gate 148. This biases transmission gate 148 into transmission which couples the $D_j$ output to ground, setting $D_j$ to 0. Since this result means that Q<i, resetting the data line to "0" is the desired response. Following a similar argument, when a "type0" (i.e, $i_j=0$) cell is encountered with its corresponding $Q_j=1$, the (Phi1+$\overline{Q_j}$) line will be low which biases transmission gate 152 off. The liability signal is therefore terminated and no further manipulation of the data value is permitted. This action is consistent with the fact that when $Q \geq i$, the data line should remain at a "1" regardless of the Q and i bits of lower significance.

As discussed, the chip illustratively provides for programmable window lengths of 3, 5, 7, and 9. For even the shorter window lengths, the digital logic required to implement rank selections among binary data was found to be overwhelming. For this reason, new analog circuit structures are disclosed to handle these operations in a very area-efficient way.

Figure 15:
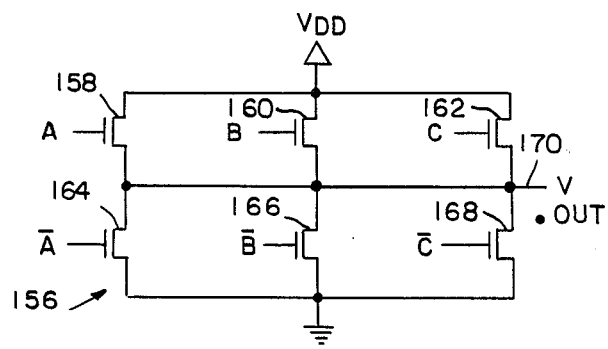
FIG. 15 illustrates a schematic of an analog circuit for a binary median filter.

Referring to FIG. 15, a voltage divider circuit 156 has three pull-up MOS transistors 158, 160, 162 and three pull-down MOS transistors 164, 166, 168. The drains of MOS transistors 158, 160, 162 are connected to VDD and the sources of transistors 164, 166, 168 are connected to ground. The sources of transistors 158, 160, 162 and the drains of transistors 164, 166, 168 are connected together to provide an output terminal 170 at which $V_{OUT}$ is generated. The gate of transistor 158 is coupled to A while the gate of transistor 164 is coupled to $\overline{A}$. The gate of transistor 160 is coupled to B while the gate of transistor 166 is coupled to $\overline{B}$. The gate of transistor 162 is coupled to C while the gate of transistor 168 is coupled to $\overline{C}$. A, B, and C comprise the bits of a data window, which, in the embodiment of FIG. 15, has a length of 3 and $\overline{A}$, $\overline{B}$, $\overline{C}$ are their complements.

The voltage divider circuit of FIG. 15 produces an output voltage ($V_{OUT}$) at output 170 which is an increasing function of the number of 1's in the window composed of binary values A, B, and C. The true values of A, B, and C drive pull-up MOS transistors 158, 160, 162 while their complements control the pull-down MOS transistors 164, 166, 168. Each transistir 158, 160, 162, 164, 166, 168 is sized with a low W/L ratio to give it a correspondingly low conductivity when it is on. Thus each datum in the window that is "1" tends to pull the analog output $V_{OUT}$ at 170 up toi the power rail, $V_{DD}$, while each window sample of "0" tends to draw the $V_{OUT}$ to ground. $V_{OUT}$ increases as the number of "1's" in the window increases. Due to the weak conductivity of any individual transistor 158, 160, 162, 164, 166, 168, the worst-case power dissipation can be controlled. A typical relationship between the number of "1's" in the window vs. the analog output voltage appears in Table 3.

TABLE 3

Typical NMOS voltage divider outputs for various numbers of "1" bits in a length three data window.

| No of "1's" in window | $V_{out}$ |
|---|---|
| 0 | 0.00 |
| 1 | 1.04 |
| 2 | 2.37 |
| 3 | 5.00 |

These values were obtained from a SPICE simulation (SPICE is an integrated circuit simulation program available from the University of California, Berkeley, and is known to those skilled in the art), based on typical device data for an NMOS process. This process accommodates two power supplies: A standard $V_{DD}=5$ volts, as used in FIG. 15, and a $V_{GG}=8$ volt supply which can be used to power circuitry that generates signals which drive transmission gates. The signals driving the devices of FIG. 15 all have eight volt logic swings to avoid a MOS threshold voltage drop across the pull-up transistors.

If the number of "1's" within the current window exceeds a user-programmable threshold, the output from this binary channel needs to be a "1," otherwise a "0." In terms of the analog circuitry, the voltage output of the voltage divider, $V_{out}$, must be compared with an analog reference voltage, $V_{REF}$, which is generated on-chip according to the rank order selection desired by the user. This comparison can be carried out using comparator circuitry similar to that described in B. Fotouhi and D. A. Hodges, "High-Resolution A/D Conversion in MOS/LSI," *IEEE J. Solid-State Circuits*, Vol. SC-14, pp. 920-926, December 1979.

The reference generator circuitry is identical to that of FIG. 15 except that one pull-up and one pull-down transistor have had their channel lengths doubled to provide conductivities that are approximately half of their original values. These "half-size" devices are always turned on, while only a subset of the remaining full-size transistors are turned on depending upon how large a $V_{REF}$ is to be generated. For example, if the window median is to be selected, one of the full-size reference generator pull-ups should be turned on, and one of the pull-downs should be on. Remembering that the two half-size transistors are always on, the only way that the voltage divider output voltage, $V_{OUT}$, can exceed $V_{REF}$ under these conditions is for at least two of the voltage divider pull-ups to be turned on, that is, only if at least two "1's" exist in the current binary data window. As another example, if the window data maximum is to be selected, both full-size reference generator pull-ups should be turned on, while both full-size pull-downs should be off. Now, $V_{OUT}$ can exceed $V_{REF}$ only if all three voltage divider pull-ups are on, that is, only if all three binary window samples are "1."

Figure 16:
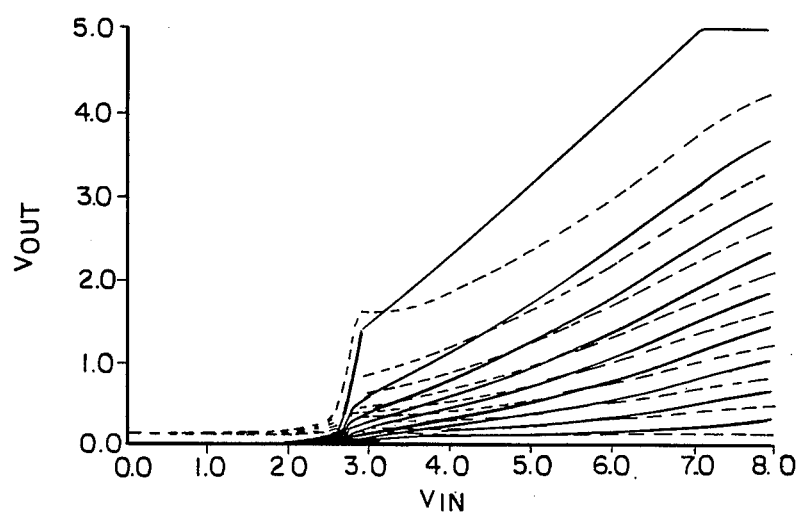
FIG. 16 illustrates a graph showing voltage transfer characteristics of a length-nine voltage divider circuit.

As a means to better understanding the operation of the voltage divider and reference generator circuits, consider tying all the voltage divider pull-up gate signals together, and calling them $V_{in}$. Also, tie all the pull-down gating voltages together, and set them equal to the complement of $V_{in}$. Now, continuously sweep $V_{in}$ from zero to $V_{GG}=8$ volts. The voltage divider output, $V_{OUT}$, would then (according to SPICE simulations) trace the upper solid curve plotted in FIG. 16. FIG. 16 shows the voltage transfer characteristics of a length nine voltage divider circuit (solid curves) and its corresponding reference generator (dashed curve). To generate the remaining solid transfer characteristics of FIG. 16, the voltage divider pull-up gating signals are successively eliminated from the $V_{in}$ tie set. When all the pull-up signals have been dropped from the $V_{in}$ set, a transfer curve is obtained coincident with the $V_{in}$ axis.

The dashed curves of FIG. 16 were obtained from simulations of the reference generator circuit in the same way, except that, again, both half-size transistors remained fully on at all times. When $V_{in}=8$ volts (the normal operating level of the pull-up and pull-down gating voltages), the $V_{OUT}$ and $V_{REF}$ voltages, though individually non-uniformly spaced, are nearly perfectly interleaved. Thus significant errors in these voltages due to process parameter variations across the chip will be well tolerated.

To further minimize the circuit's sensitivity to process variations, each threshold channel is provided with its own reference generator as well as its own voltage divider. Also, in order to reduce the number of distinct subcircuits involved in the chip design, a pair of pull-up and pull-down transistors from both the voltage divider and reference generator circuits are included within each bit storage cell of the shift register holding the binary samples contained within the current threshold channel window.

Figure 17:
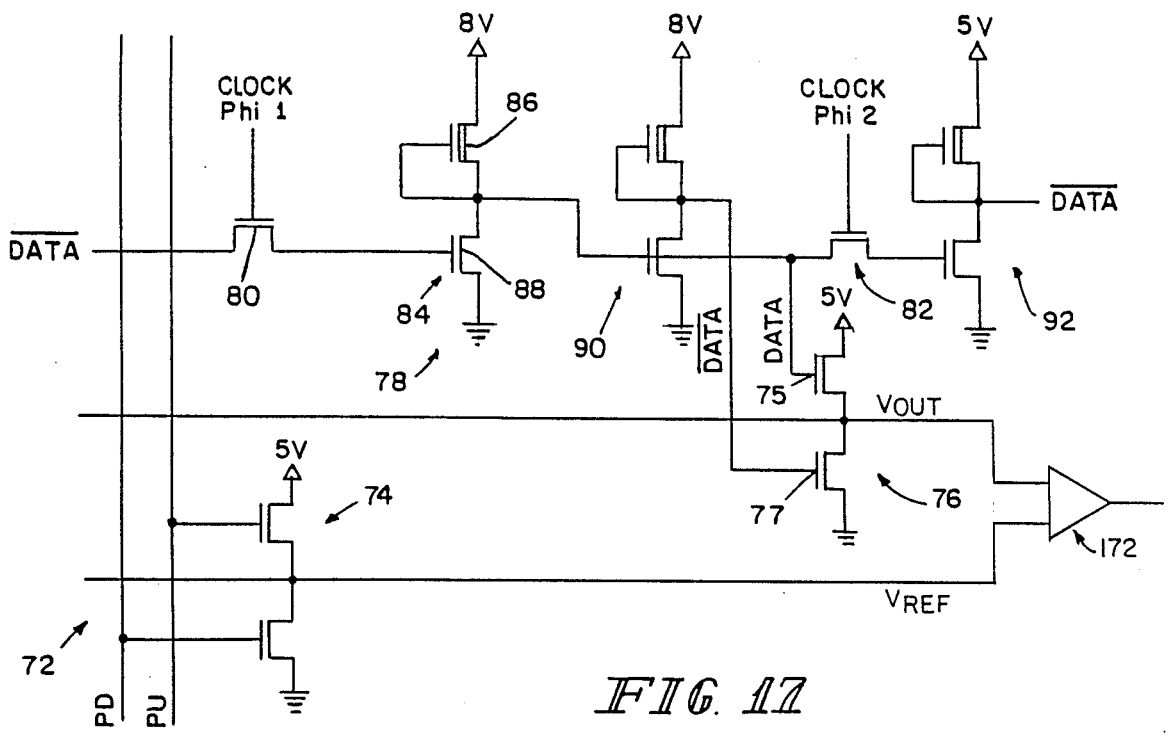
FIG. 17 illustrates a schematic of a circuit for a single bit of a binary filter.

Referring to FIG. 17, a schematic diagram of a circuit for a single window data cell containing one bit of shift register storage, one leg of a voltage divider, and one leg of a reference generator is shown. The circuit of FIG. 17 is illustratively replicated nine times to create a binary median filter which can have a maximum data window length of nine bits. Binary median filter cell 72 includes a first inverter 74 which comprises one leg of the reference generator circuit which is constructed in similar fashion to the circuit of FIG. 15 as discussed previously. The inputs of inverter 74 are connected to PD and PU reference generator control signals which are common to all the threshold channels and are driven by a programmable logic array (PLA) located on-chip. The PLA, in turn, receives its inputs from primary chip inputs that can be strapped by the user to specify the desired ranked order selection.

Cell 72 also includes inverter 76 which comprises one leg of the voltage divider which is constructed similar to the voltage divider circuit of FIG. 15. Instead of the three inverters shown in FIG. 15, the complete voltage divider circuit of which inverter 76 is a part would illustratively have nine inverters. Input 75 (the gate of the pull-up MOS transistor of inverter 76) is connected to the DATA output of a shift register cell 78 and input 77 (the gate of the pull-down MOS transistor of inverter 76) is connected to the $\overline{\text{DATA}}$ output of shift register cell 78.

Shift register cell 78 comprises a transmission gate 80, the gate electrode of which is connected to a source of Phi 1 clock pulses (not shown) and a transmission gate 82, the gate electrode of which is connected to a source of Phi 2 clock pulses. Phi 1 and Phi 2 are square wave clock pulses which cannot both be high simultaneously and are generated in a manner well known to those skilled in the art.

The input to transmission gate 80 is connected to a $\overline{\text{DATA}}$ signal coming from either the data input signal or from one of the previous shift register stages. The output of transmission gate 80 is connected to an input of inverter 84 which has a depletion mode pull-up MOS transistor 86 and an enhancement mode pull-down MOS transistor 88. The output of inverter 84 is the DATA output of shift register cell 78 and is connected to an input of inverter 90, which is identical to inverter 84, to input 75 of the inverter 76 of the voltage divider and to an input of transmission gate 82.

The output of inverter 90, which is the $\overline{\text{DATA}}$ output of shift register cell 78, is coupled to input 77 of inverter 76. The output of transmission gate 82 is connected to the input of inverter 92 and the output of inverter 92 is connected to the next shift register stage or, if cell 72 is the last stage, is left floating.

In operation, Phi 1 goes high causing the $\overline{\text{DATA}}$ signal at the input of transission gate 80 to be passed through to the input of inverter 84. Inverter 84 inverts the $\overline{\text{DATA}}$ signal to produce a DATA signal which is applied to the input of inverter 90, to the input 75 of inverter 76, and to the input of transmission gate 82. Inverter 90 inverts the DATA signal at its input and produces a $\overline{\text{DATA}}$ signal which is applied to the input 77 of inverter 76. At this point, the output of inverter 76 will take on a voltage determined by the DATA and $\overline{\text{DATA}}$ signals. The outputs of all the inverters of the various voltage divider legs sum to produce a voltage indicative of the status of the bits in the data window as was more fully described with reference to FIG. 15.

When Phi 1 falls low, transmission gate 80 is biased into cut-off which blocks the $\overline{\text{DATA}}$ signal at its input from passing through to its output and thereby to the input of inverter 84. However, due to the capacitive nature of the input of inverter 84, the $\overline{\text{DATA}}$ signal which is present at that input when Phi 1 falls low will be retained for several milliseconds. This is commonly referred to as a dynamic memory.

Shortly after Phi 1 falls low, Phi 2 goes high biasing transmission gate 82 into transmission. The DATA signal at the input of transmission gate 82 is passed through to the input of inverter 92 which produces a $\overline{\text{DATA}}$ signal to be passed on to the next stage of the shift register.

From simulations, the worst case difference between any $V_{OUT}$ and $V_{REF}$ is approximately 100 mV. This small voltage difference must be amplified to a 5 volt difference in order to restore the signal to a digital level.

The $V_{OUT}$ and $V_{REF}$ lines of the circuit of FIG. 17 are coupled to $V_{OUT}$ and $V_{REF}$ inputs of a comparator or differencing circuit 172.

Referring to FIG. 18, the differencing circuit 172 comprises transmission gates 174, 176, 178, inverters 180, 182, and capacitors 184, 186. An electrode of transmission gate 174 is connected to $V_{REF}$, a gate electrode is connected to Phi 1 (a clock as discussed previously) and an output electrode is connected to a node 183. One terminal of capacitor 184 and an output of transmission gate 176 are also connected to node 183. Transmission gate 176 has an electrode connected to $V_{OUT}$ and a gate electrode connected to Phi 2 (a clock as discussed previously).

The remaining terminal of capacitor 184 is connected to a node 185 which is also connected to an electrode of transmission gate 178, an input of inverter 180, and to one terminal of capacitor 186. The other terminal of capacitor 186 is connected to $\overline{\text{Phi 1}}$. A gate electrode of transmission gate 178 is connected to Phi 1. An output electrode of inverter 180 is connected to an electrode of transmission gate 178 and to a gate electrode of inverter 182.

The operation of differencing circuit 172 is as follows. When Phi 1 goes high, transmission gate 174 connects $V_{REF}$ to node 183 to charge capacitor 184. Transmission gate 178 shorts the output of inverter 180 to its input. This causes the operating point of inverter 180 to be at the intersection of the two curves shown in FIG. 19 when Phi 1 goes low. This shorting technique has now biased inverter 180 in its high gain region, regardless of process parameter variations.

When Phi 1 goes low, transmission gates 174 and 178 are shut off and, as Phi 2 goes high, transmission gate 176 connects node 183 to $V_{OUT}$. If $V_{OUT} < V_{REF}$, the voltage at node 183 will decrease and this decrease will couple over to the input of inverter 180 at node 185. This will cause the output of inverter 180 to increase significantly. Inverter 182 provides additional application and also brings the signal back to its "true" value.

On the other hand, if $V_{OUT} > V_{REF}$, the voltage at node 183 will increase slightly. An increasing voltage at node 183 will couple through to the input of inverter 180 and cause its output to decrease significantly.

Again, the second inverter restores the signal to a digital level of the "true" output.

Capacitor 186 compensates for any noise produced at node 185 during the decline of the Phi 1 signal at transmission gate 178. The gate-overlap capacitance of transmission gate 178 together with a rapidly falling Phi 1 signal could cause the voltage on node 183 to drop slightly which favors the $V_{OUT} < V_{REF}$ decision. Capacitor 186 is appropriately sized to compensate for the voltage drop that node 185 experiences by providing a rising-voltage coupling into node 185 to offset the previous loss.

Capacitors 184, 186 are MOS transistors configured as capacitors. The gate electrode of the MOS transistor is one plate of the capacitor and the drain-source is the other plate. This configuration results in a nearly linear capacitor in the accumulation region of MOS operation. To insure that these MOS devices are always accumulated for the range of voltages which will be encountered, an additional phosphorus implant will be performed to shift the non-linearity in the capacitance curve beyond the range of possible voltages.

FIG. 20 is a timing diagram for a chip implementing threshold decomposition filtering utilizing the circuits discussed above. The clip contains conventional circuitry for producing Phi 1 and Phi 2 from an external clock. It is important to remember that Phi 1 and Phi 2 are complements of each other and Phi 2 will not begin a transition to high until Phi 1 has fallen fully low and vice-versa. When Phi 1 transitions low (point 188), the input code word must be valid at the input pins of the chip. When Phi 2 goes high (point 190), the results of the threshold decomposition of the input code word are stored in the first stages of the shift registers of the binary filters. After the next low-high transition of Phi 1 (point 192), $V_{REF}$ charges a 1 pF capacitor (capacitor 184 in FIG. 18). Upon the next low-high transition of Phi 2 (point 194), $V_{OUT}$ charges, or discharges, the 1 pF capacitor. Next, when Phi 2 transitions low (point 196), a digital value corresponding to $V_{REF} - V_{OUT}$ is latched. Upon the next low-high transition of Phi 1 (point 198), the high order bits of the output code word internal to the chip are valid. When Phi 2 next transitions high (point 200), the low order bits of the output code word are valid. Shortly thereafter, the output code word will be available at the output pins of the chip for a period of time indicated by arrow 204.

The chip is pipelined at several stages in order to increase the throughput rate of the chip. Three pipeline breaks are inserted; after the threshold decomposition stage, 190, after the $V_{REF} - V_{OUT}$ differencing stage, 196, and in the middle of the code work reconstruction stage, after 198. These pipeline breaks cause a latency of three clock periods between the reading of the input code word and the generation of the desired result.

FIG. 21 shows how shorter window lengths and recursive filtering options are realized. A shift register 206 illustratively has nine bits of storage as shown by blocks 1-9. When the window length is nine, multiplexers 208, 210, 212, 214, 216 pass data from the previous shift register stage to the next shift register stage. However, if the window length is less than nine, the flow of data is terminated after the appropriate shift register stage. The unused stages in the shift register are forced to the logic "1" state. Forcing "1's" into the vacant window locations tends to increase the reliability of the threshold channel result. The increased reliability results from the fact that if "1's" are placed in the unused shift register locations, the upper curves in FIG. 16 will be used more often and several of the bottom curves will not be used at all. The upper curves have a greater voltage spacing than the lower curves, making it easier to arrive at a digital difference signal when the upper curves are used.

If recursive filtering has been specified by the user, one of the multiplexers 208, 210, 212, 214, 216 is set so that the output of the differencing circuitry (the result of the ROF for the particular threshold channel being observed) is fed back into the appropriate shift register in the position immediately to the right of the center location in the window, as required by the recursive filtering technique.

It was shown previously that, viewed collectively, the $2^N$ binary rank order filter outputs contain a "threshold decomposed" representation of the output that would have been seen if a conventional N-bit ROF (ranked order filter) had been used. It is the job of the code word reconstruction circuitry to determine this N-bit output word by finding the breakpoint between the string of "0's" and "1's" being produced by the $2^N$ binary ROF channels. That is, if the string of "1's" ends at threshold channel i, and the string of "0's" begins with channel i+1, the reconstruction circuit output should be the standard base-2 representation for the integer i.

The key to implementing the silicon layout of the reconstruction circuit in an orderly way is the use of a special assignment of threshold channels to physical bit slices on the chip. The obvious assignment would be to associate threshold channel Number 0 with bit slice Number 0, threshold channel Number 1 with slice Number 1, etc. Within the code word reconstruction block layout, however, this assignment leads to many very long inter-channel interconnects. This, in turn, results in increased propagation delay. Also, there is a disappointing degree of regularity within the layout which naturally increases the number of opportunities for wiring errors that can be difficult to uncover after layout is complete.

The channel assignment used in this design is based on the bit reversal operation that appears in the final stages of the Fast Fourier Transform algorithm. First, the physical bit slices on the layout are numbered sequentially from 0 to $2^N - 1$. Next, each slice number is sequentially expressed in binary. Thus, if N=4, then slice Number 5 is labelled 0101. Finally, these binary slice numbers are bit-reversed so that, for example, the slice Number 5 label appears as 1010. The results are the binary representations of the numbers of the threshold channels that should occupy the physical bit slices. Thus, slice Number 5 should be used to implement threshold channel number ten.

Table 4 sets forth the channel assignments for the N=3 case.

TABLE 4

| Bit Slice No. | Binary Bit Slice No. | Bit Reversal | Channel Assignment |
|---|---|---|---|
| 0 | 000 | 000 | 0 |
| 1 | 001 | 100 | 4 |
| 2 | 010 | 010 | 2 |
| 3 | 011 | 110 | 6 |
| 4 | 100 | 001 | 1 |
| 5 | 101 | 101 | 5 |
| 6 | 110 | 011 | 3 |
| 7 | 111 | 111 | 7 |

FIG. 22 is a flow diagram of a complete code word reconstruction circuit for the N=3 case, utilizing threshold channels numbered from 0-7.

The first stage 93 of the code word reconstruction circuit, as shown by the flow diagram of FIG. 22, comprises bit slices 94, 96, 98, 100, 102, 104, 106, 108. In the assignment scheme discussed above, bit slice 94 corresponds to bit slice 0 and is assigned to threshold channel 0, bit slice 96 corresponds to bit slice 1 and is assigned to threshold channel 4, bit slice 98 corresponds to bit slice 2 and is assigned to threshold channel 2, bit slice 100 corresponds to bit slice 3 and is assigned to threshold channel 6, bit slice 102 corresponds to bit slice 4 and is assigned to threshold channel 1, bit slice 104 corresponds to bit slice 5 and is assigned to threshold channel 5, bit slice 106 corresponds to bit slice 6 and is assigned to threshold channel 3, and bit slice 108 corresponds to bit slice 7 and is assigned to threshold channel 7.

The second stage 109 of the code word reconstruction circuit represented by FIG. 22 comprises bit slices 110, 112, 114, 116. Conceptually, a four-pole, single throw switch 118 couples the second stage 109 to the first stage 93. Poles 120, 122, 124, 126 of switch 118 selectively connect bit slices 110, 112, 114, 116, respectively, of second stage 109 to either bit slices 94 (threshold channel 0), 98 (threshold channel 2), 102 (threshold channel 1), 106 (threshold channel 3), respectively, or to bit slices 96 (threshold channel 4), 100 (threshold channel 6), 104 (threshold channel 5), 108 (threshold channel 7), respectively. Bit slice 96, assigned to threshold channel 4, represents the most significant bit of the code word to be reconstructed, and is used to control switch 118 as indicated by the dashed line 128.

A third stage 130 of the code word reconstruction circuit comprises bit slices 132, 134. The third stage 130 is coupled to the second stage 109 by a double pole, single throw switch 136. Poles 138, 140 of switch 136 selectively connect bit slices 132, 134, respectively, to either bit slices 110, 114, respectively, or to bit slices 112, 116, respectively. Bit slice 112 determines the state of the next most significant bit of the code word to be reconstructed, and is used to control switch 136 as shown by dashed line 142.

The state of the MSB, the $2^2$ bit, of the code word is determined by the state of bit slice 96 (threshold channel 4) which also determines which of the threshold channels will be passed to the second stage 109. If threshold channel 4 is a 0, the MSB of the code word is set to 0 and switch 118 couples threshold channels 0-3 (bit slices 94, 98, 102, 106) to second stage 109. If threshold channel 4 is a 1, as shown in the embodiment of FIG. 22, the MSB of the code word is set to 1 and switch 118 couples threshold channels 4-7 (bit slices 96, 100, 104, 108) to second stage 109. In FIG. 22, threshold channel 4 is a 1 so the MSB of the code word is set to 1 and threshold channels 4-7 are coupled to second stage 109.

The next most significant bit, the $2^1$ bit, of the code word is determined by the state of bit slice 112 of second stage 109 which, in the example shown in FIG. 22, is threshold channel 6. If bit slice 112 is a 0, the next most significant bit is set to 0 and switch 136 couples bit slices 110, 114 to third stage 130, as shown in the embodiment of FIG. 22. If bit slice 112 is a 1, the next most significant bit is set to 1 and switch 136 couples bit slices 112, 116 to third stage 130.

The least significant bit, the $2^0$ bit, of the code word is determined by the state of bit slice 134, which is, in the embodiment of FIG. 22, threshold channel 5. If bit slice 134 is a 0, the LSB is set to 0. If the bit slice 134 is a 1, as it is in FIG. 22, the LSB is set to 1. It should be remembered that if any given threshold channel is a 1, all the threshold channels numbered less than that threshold channel will also be 1.

To summarize, the MSB of the code word is given directly by the output of slice number 1 (bit slice 96 which is assigned to threshold channel 4). If the output of slice number 1 is 0, then only filter outputs 0, 1, 2, 3, i.e., threshold channels 0-3, need be examined to determine the remaining N-1 code word bits. Thus, the current values of only these filter outputs will be passed on to the next reconstruction stage. On the other hand, suppose the current output of threshold channel 4 is 1. The MSB of the output code word will, of course, also be 1. In this case, however, a different set of filter outputs will need to be passed along to the later reconstruction stages in order to determine the remaining code word bits: namely outputs number 4, number 6, number 5, and number 7 (threshold channels 4-7). This multiplexing of two groups of four filter outputs each can be viewed as four separate two input multiplexing operations all "ganged" to the same control bit, namely the second input bit presented to this stage. Importantly, the input to each multiplexer will occupy the same relatively-positioned input line at each rank within the reconstruction circuit. In addition, the physical regularity of the chip structure (and thus its design reliability) is largely preserved.

If the data flow is traced through the remaining two reconstruction stages of FIG. 22, these regular structural properties are preserved: Multiplexer input lines never cross, and the multiplexer control but (and thus the code word output bit) for a given stage is always the second bit in the incoming data sequence.

Figure 23:
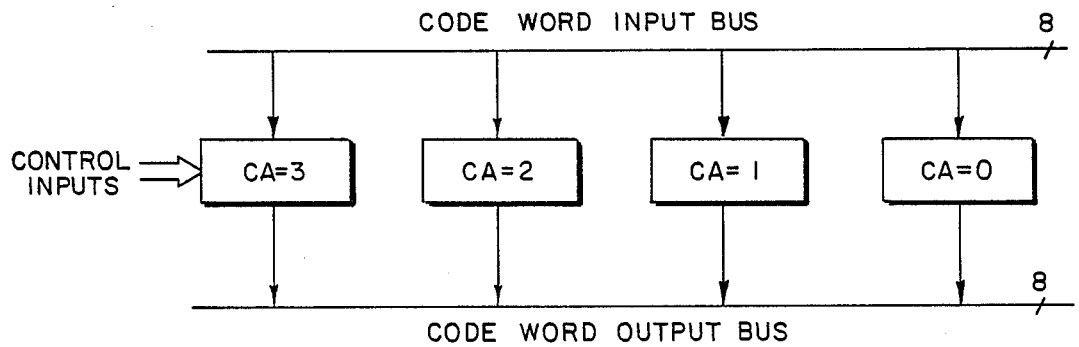
FIG. 23 is a block diagram of four 6-bit chips combined to emulate a ROF on 8-bit code words.

Illustratively, a chip designed using a $5\mu$ process will accommodate 6-bit code words. The number of bits in the code words is limited due to the physical size of the chip itself. Using a $2\mu$ technology could enable a signal package to perform ROF on 8-bit code words. In order to overcome the 6-bit code word limitation for a chip designed using a $5\mu$ process, additional circuitry is added on-chip so that, for example, four 6-bit chips could emulate a ROF on 8-bit code words. The important design criteria for cascading the chips is that each of the four chips must be electrically identical. In other words, four chips of the same design are used; and the only difference between them is how their input control signals are pin-programmed. The four chips will work in parallel but only one of these chips will derive the output code word. A typical system is shown in FIG. 23.

Figure 24:
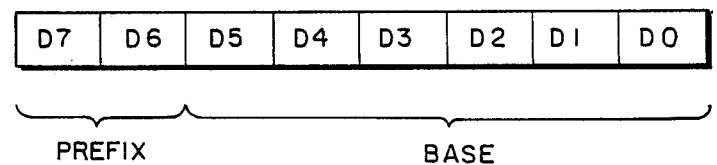
FIG. 24 shows an 8-bit word code partitioned into a prefix and a base.

Each chip is assigned a "chip address". This chip address, denoted as CA, is pin-programmed into the chip input control lines so that each chip can tell where it is located relative to the other chips in the system. The 8-bit code word is then structurally partitioned into a "prefix" and a "base+ as shown in FIG. 24.

The 6-bit base is sent to the 6 code word input pins of each ROF chip. The prefix (PR), however, is compared to the chip address (CA). The result of this comparison allows the chip to send the "appropriate" input signals to the $2^N$ threshold channel inputs as described in Table 5.

TABLE 5

| Comparison Result | Action |
| --- | --- |
| CA > PR | Pass all "0's" to threshold channel inputs |
| CA = PR | Pass threshold decomposition result to threshold channel inputs |
| CA < PR | Pass all "1's" to threshold channel inputs |

The decision of whether to tri-state the output code word bus or to drive this bus is made by comparing the outputs of two threshold channel outputs. The first threshold channel output to be involved in the comparison is the output of threshold channel No. 0 of the chip being observed. The second threshold channel output to enter the comparison is the output of threshold channel No. 0 of the chip of higher significance (i.e., has a CA one greater than the CA of the chip under observation.) The truth table of the tri-state signal that must be generated is shown in Table 6.

TABLE 6

| Threshold Channel Output No. 0 Whose CA = X + 1 | Threshold Channel Output No. 0 Whose CA = X | Tri-state Signal |
| --- | --- | --- |
| 0 | 0 | 1 |
| 0 | 1 | 0 |
| 1 | 0 | d |
| 1 | 1 | 1 |

The Boolean equation for Table 6 is $$TS = CA_{X+1} + \overline{CA_X}$$

where $CA_X$ represents the output of threshold channel No. 0 whose CA=X, and $CA_{X+1}$ represents the output of threshold channel No. 0 whose CA=X+1.

If a direct approach to this problem of deriving the tri-state signal is taken, the output of threshold channel No. 0 must be obtained from the chip of higher significance. This method involves inter-chip communication which undoubtedly will cause a long delay time needed to generate the tri-state signal due to the large capacitance encountered when attempting to drive a node external to the chip. For this reason, a more suitable approach is taken. The threshold channel No. 0 of the more significant chip has been duplicated on each individual chip as an "extra channel." This situation leads to a rapid generation of the tri-state signal with only a minimal area penalty. The input to this extra channel is determined by a PLA. It turns out that the input bit to the extra threshold channel is a "1" when CA<PR.

Figure 25:
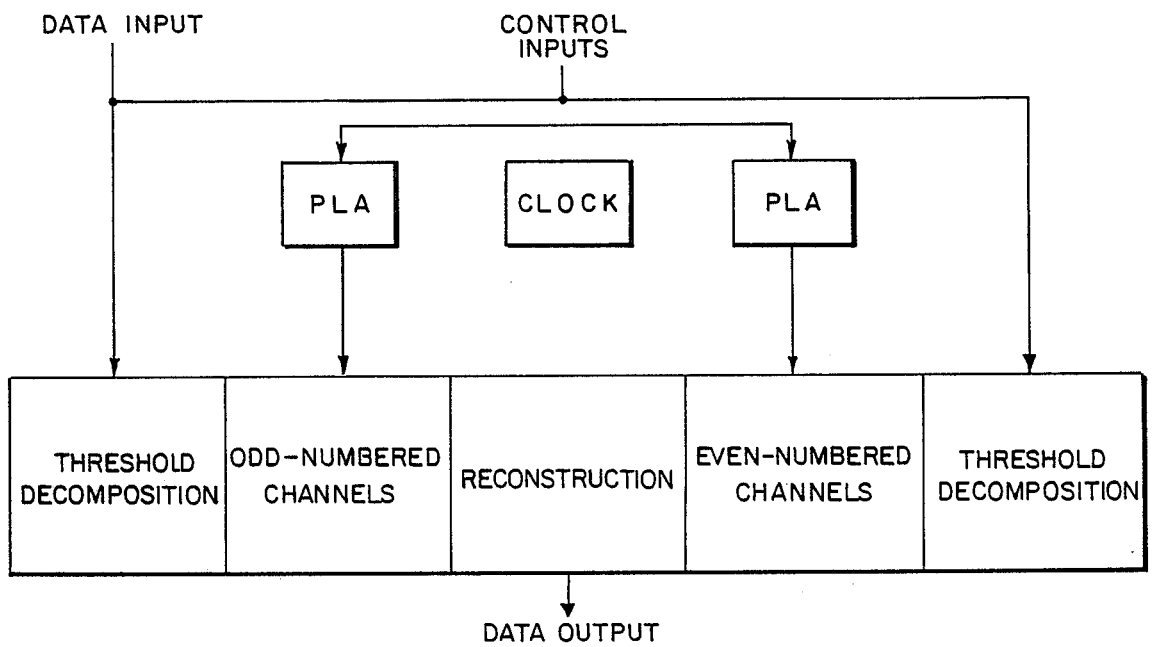
FIG. 25 illustrates a block diagram of an integrated circuit implementing the threshold decomposition filtering of this invention.

An illustrative overall chip "floor plan" being followed in this design is shown in FIG. 25. In order to achieve a chip dimensional aspect ratio near unity, the threshold channels have been split into two physical clusters. The odd-numbered channels have been placed to the left of center while the even-numbered channels appear to the right.

Illustratively, the chip can be fabricated in a 5μ silicon-gate NMOS technology that provides for buried contacts and a single level of metallization. However, it is preferrable that 2μ CMOS technology be used. Additional specifications and features of this chip are:

(1) Four data window lengths are selectable by pin strapping: 3, 5, 7, and 9.

(2) Pin strapping options allow any element in the rank order to be selected by the filter including "min," "max," "median," or any of the others for which conventional names are not available.

(3) The filter can operate in either the nonrecursive or recursive modes, again by strapping an input pin to either a "1" or a "0."

(4) Input and output code words can be a maximum of N=6 bits. Additional circuitry has been placed on the chip to permit two or more filters to be "ganged" to accommodate longer code words. Thus, two chips working jointly can accept 7-bit samples, while four chips can handle 8-bit code words. Translating the layout into a 2μ technology permits 8-bit samples to be accommodated by a single circuit.

(5) Chip size will be approximately 200 mils square.

(6) Maximum sample rate of the chip, as estimated from stimulations, should be in the 5 MHz range.

(7) The use of pipelining in the design introduces a latency of three clock periods between data input and output.

The outputs signals from binary ranked order operators possess what will be called the stacking property. This property says that if binary output signals are piled on top of each other according to their threshold levels, then what results is always a column of 1's with a column of 0's on top (see FIG. 3 for an example). The desired output is then the level at which the transition from 1 to 0 takes place. Since this transition point can be determined by applying a binary search operation to the binary output signals, implementation of the reconstruction section becomes feasible. In fact, if the threshold levels are rearranged in bit reversed order, this section can be constructed in a way which takes up very little chip area and has very few crossed metal paths, as shown in FIG. 22. Thus, by simplifying the reconstruction section, the stacking property of ranked order operators makes possible an efficient VLSI implementation of a new architecture for these filters.

Other filters have been found to possess both this architecture and the stacking property. These filters are all those that can be obtained by replacing the binary median filters in FIG. 6 with positive Boolean functions. Since the stacking property is the common property shared by all these filters, they will be called Stack Filters.

Before determining which binary functions possess the stacking property, some notation must be developed and the formal definitions of the threshold decomposition and stacking property given.

Vector notation will be used for sequences, so that signal s of length n will be written $\vec{s}_n = (s_1, \ldots, s_n)$. If the sequence $\vec{s}_n$ is a binary sequence, it will be marked as $\vec{s}_{b,n}$ to make this clear. When the value of n is clear from the context, it will be dropped.

As for relations between sequences, suppose $\vec{x}_{b,n} = (x_1, \ldots, x_n)$ and $\vec{y}_{b,n} = (y_1, \ldots, y_n)$ are two binary sequences of length n. Then, $\vec{x}_b = \vec{y}_b$ if and only if $x_i = y_i$ for all i. Further, $\vec{x}_b \leq \vec{y}_b$ if $x_i = 1$ implies $y_i = 1$ for all i; and if $\vec{x}_b \neq \vec{y}_b$, then $\vec{x}_b < \vec{y}_b$.

Some notation for the functions being considered is needed. Because of the threshold decomposition, the principal area of interest is binary filters. A binary filter is essentially a Boolean logic function. These functions will always be capitalized and the function name will often include a number of variables. Thus, a binary function B with n inputs can be denoted Bn. If the binary function Bn is applied to the sequence $\vec{x}_{b,n}$ then the output is denoted by either $Bn(\vec{x}_{b,n})$ or $Bn(x_1, x_2, \ldots, x_n)$ depending on what is more appropriate at the time.

Since the n on the binary sequence is redundant, it will often be dropped.

As an example illustrating this notation for functions, consider the window width three median filter. If the input to this filter is restricted to binary values, it becomes a binary function which is denoted MF3. If this filter is applied to the sequence $\vec{s}_b=(1,0,0)$, it produces a zero; that is, $MF3(1,0,0)=MF3(\vec{s}_b)=0$. Similarly, $MF3(1,0,1)=1$, while $MF3(0,1,0)=0$. In general, the output of MF3 is a 1 if and only if at least two of the input bits are 1.

Such a binary filter could be represented as a truth table. However, if a rule defining the output of the filter can be deduced, the filter can be more compactly represented as a Boolean expression. For example, the rule for MF3 implies that $$MF3(x_1,x_2,x_3) = x_1x_2 + x_2x_3 + x_1x_3 \quad (39)$$

Finally, some notation is needed for the overall operation that is implemented by placing the binary operator B at each threshold level in the threshold decomposition architecture shown in FIG. 6. This operator is called the stack filter $S_B$ if B obeys the stacking property that will be defined below. For example, if each binary filter in FIG. 6 is the window width three median filter MF3, the whole filter is the stack filter $S_{MF3}$.

Definition: The threshold decomposition of the M-valued sequence $\vec{s}_N$ is the set of M-1 binary sequences, called threshold signals, $\vec{T1}_b, \vec{T2}_b, \ldots, \vec{T(M-1)}_b$, whose elements are defined by $$\vec{Tl}_b(j) = \begin{cases} 1 & \text{if } \vec{s}(j) \geq i \\ 0 & \text{if } \vec{s}(j) < i \end{cases} \quad (40)$$

where i represents a threshold level and j represents a signal element.

For an example showing a set of threshold signals and the signal they came from, see the left hand side of FIG. 3. Note that threshold signals always obey the stacking property, which is the following:

Definition: An ordered set of L binary sequences $\vec{S1}_b, \vec{S2}_b, \ldots, \vec{SL}_b$ in which the sequences all have the same length m, is said to obey the stacking property if $$\vec{S1}_b \geq \vec{S2}_b \geq \ldots \geq \vec{SL}_b \quad (41)$$

It was stated above that the outputs of the binary ranked order operators in FIG. 3 also have the stacking property. This leads to a definition of the stacking property for binary functions as well as ordered sets of sequences.

Definition: A window width n binary function Bn is said to have the stacking property if $$Bn(\vec{x}) \geq Bn(\vec{y}) \text{ whenever } \vec{x} \geq \vec{y} \quad (42)$$

Recall that it is because the binary ranked order filters have this stacking property that the reconstruction technique shown in FIG. 22 can be used. This reconstruction technique makes possible an efficient VLSI implementation of these filters.

A necessary and sufficient condition for a binary function to satisfy the stacking property was found by E. N. Gilbert, "Lattice-Theoretic Properties of Frontal Switching Function," *Journal of Math. and Phys.*, Vol. 33, pp. 57-67, 1954. His interest in this property came from certain problems in digital design, but the result carries over directly to the signal processing problem. This and other properties of stackable binary functions are discussed below. It will be seen that there are a large number of these functions, and therefore a large number of stack filters.

Theorem 7:

An n-input binary function Bn will have the stacking property $Bn(x_1,x_2,\ldots,x_n) \geq Bn(y_1, y_2, \ldots, y_n)$ when $x_i \geq y_i$ for all i if and only if Bn can be expressed as a Boolean function which contains no complements of the input variables. Gilbert called functions satisfying this property frontal functions; elsewhere they are called positive Boolean functions.

Applying this theorem to the operator MF3 in Equation (39). MF3 is found to have the stacking property, while the function $AI3(x_1,x_2,x_3) = \overline{x_1x_2x_3}$ does not, since it contains complements. Thus, a stack filter with a VLSI implementation can be created from MF3 but not from AI3.

Note that the condition which guarantees stacking is not very restrictive. As a result there are many positive Boolean functions, and since each such function defines a stack filter after it is inserted in the architecture of FIG. 6, there are just as many stack filters. In fact, there are exactly 20 window width three stack filters, 7581 with window width five, and more than $2^{35}$ with window width nine. The exact number of these functions for any arbitrary window width is not known at this time. What is important is that there are a lot of them.

The binary functions which stack, the positive Boolean functions, are a subset of unate functions. A unate function is any binary function that can be obtained by complementing some of the input variables of a positive Boolean function. Unate functions have the interesting property that each has a unique minimum-sum-of-products (MSP) expression. This does does not hold for all Boolean functions. Thus, each positive Boolean function, and hence each stack filter, can be expressed in terms of a unique minimum sum-of-products (MSP) Boolean expression. The unique minimum expression for the window width three median filter was provided in Equation (39).

There are two basic operations that will map one positive Boolean function to another positive function. First, if the input variables to a positive function are permuted, the new function is clearly positive. This is particularly true if the order of the variables is reversed. Second, if all the variables in a positive Boolean expression are complemented, and then the total expression is complemented, the function so defined is positive. The new function is called the dual of the original function.

These operations correspond to basic transformations of stack filters. Obviously, reversing the order of the variables in a positive function B reverses the time-sense of the stack filter $S_B$. Replacing B in a threshold decomposition by its dual function will reverse the sense of the M levels. If the original filter produces an output sequence z(t) for an input x(t), then the new filter will produce an output $M-1-z(t)$ for an input $M-1-z(t)$.

Since median and ranked-order filters are nonlinear, the analysis of any of these filters cannot be reduced by considering the filtering of an input signal and the filtering of noise separately. Instead, the problem must be approached syntactically and a determination made of which features of a noisy input signal are preserved by a filter, and which are eliminated.

For a median filter, this led to the idea of a root, which is any signal that is invariant to filtering by that filter. The roots of a median filter are considered to be the desired noiseless signals. Any other signal must change under filtering by the median filter, and will eventually converge to a noiseless root under repeated passes of the filter.

As stack filters are generalizations of median filters, they can be analyzed in a similar manner. Here, conditions for the existence of invariant signals and for the convergence of arbitrary signals to invariant signals under repeated passes of a stack filter can be derived. As the structure of median filter roots is well known, the discussion will focus on other filters that preserve these signals.

Because of the threshold decompositions, only binary filters need be considered. Hence, each basic result will be in terms of strings of zeros and ones. Also, as a Boolean expression is a convenient way to represent a binary filter, each basic result is restated in terms of these expressions.

Definition: Let $\vec{s} = (s(1), \ldots, s(L))$ be an M-level signal of length L. Then, for a filter of window width $2N+1$, the corresponding appended signal is $\vec{s}' = (s(1), \ldots, s(1), s(2), \ldots, s(L-1), s(L), \ldots, s(L))$, where $s(1)$ and $s(L)$ are repeated $N+1$ times.

If a signal has finite length, samples must be appended to the ends of the signal so that the output of a stack filter is defined for all positions of the window on the signal. If there were no appended samples, the filter window would overshoot the signal when centered on samples near the ends.

Definition: The roots of a stack filter $S_B$ are all the appended signals that are invariant under filtering by $S_B$. The roots of a median filter of window width $2N+1$ are all the appended signals consisting of monotonic regions alternating with constant regions of at least $N+1$ samples.

To begin finding some roots of stack filters, stack filters which preserve increasing signals are found. Then, those that preserve decreasing signals, and those that preserve median filter roots can be found. To simplify the representation of binary sequences, $0^m$ and $1^m$ will be used to denote 0 or 1, repeated m times.

Theorem 8:

Suppose that an M-level stack filter $S_B$, based on a positive Boolean function B, has window width $2N+1$.

Then, $S_B$ preserves all increasing (non-decreasing) signals if and only if $B(0^N 1^{N+1}) = 1$ and $B(0^{N+1} 1^N) = 0$.

Since binary filters are better represented by Boolean expressions than by truth tables, a restatement of Theorem 8 in terms of such expressions is valuable.

Corollary 1: Let $S_B$ and B be as in Theorem 8. Then $S_B$ preserves all increasing M-level signals if and only if (a) Every term in the MSP form of $B(x_1, \ldots, x_{2N+1})$ that contains only variables from $\{x_{N+1} \ldots, x_{2N+1}\}$ must contain $x_{N+1}$.

(b) There exists at least one such term.

For example, for a window width of 3, the filter based on $B(x_1, x_2, x_3) = x_1 + x_2 x_3$ will preserve increasing signals. By reversing the order of the variables in the previous two results, two similar results about decreasing signals are obtained.

From the definition of the roots of a median filter, the roots of a median filter of window width $4N+1$ will appear locally monotone to a window of width $2N+1$. In other words, for any position of the smaller window, the samples inside it will form either an increasing or a decreasing sequence. These window sequences are exactly those for increasing and decreasing signals. Theorem 9 results.

Theorem 9:

Let $S_B$ be an M-level stack filter of window width $2N+1$. Then $S_B$ preserves the roots of a median filter of window width $4N+1$ if and only if $S_B$ preserves all M-level monotonic signals.

Using the previous results, all stack filters of any window width can be classified according to the locally monotone signals that they preserve.

A stack filter may preserve other signals that are not locally monotone. For example, many of the roots of a median filter of window width $2N+1$ are not locally monotone with respect to that window size. Also, the previous theorems do not address the convergence properties of stack filters. They do not guarantee that any appended signal will converge to an invariant signal under repeated filtering by a stack filter.

If a stack filter of window width $2N+1$ preserves the roots of a median filter with a window width greater than $4N+1$, it must preserve the roots of a median filter of window width $4N+1$. The possible window sequences are the same for both sets of roots. Also, if a stack filter preserves the roots of a median filter of window less than $4N+1$, it must preserve all median filter roots for larger window widths, including $4N+1$. Therefore, if a stack filter preserves the roots of any median filter, it must satisfy Theorem 9. Whether or not such a filter will preserve the roots of median filters with window widths less than $4N+1$ is discussed below.

Theorem 10:

Suppose that a stack filter $S_B$ of window width $2N+1$ is based on a positive Boolean function B. Then, $S_B$ preserves the roots of a median filter of window width $2N'+1 (N \leq N' \leq 2N-1)$ if and only if B satisfies the conditions (a) $B(0^m 1^{N'} + 1 0^{2N-N'-m}) = 1 \quad N-N' \leq m \leq N$ (b) $B(1^m 0^{N'+1} 1^{2N-N'-m}) = 0 \quad N-N' \leq m \leq N$ Essentially, the conditions of the theorem guarantee that each binary filter in $S_B$ will preserve all constant regions of at least $N'+1$ ones or zeros. Hence, each binary filter will preserve all binary roots of the median filter, and $S_B$ preserves all M-level roots of the same filter.

Given a positive Boolean function of n variables B, and a binary window sequence $\vec{y}_{b,n}$, $B(\vec{y}_{b,n}) = 1$ if and only if the assignment $x_i = y_i \; i = 1 \ldots n$ causes at least one term in the MSP expression of B to be 1. Hence, a version of Theorem 10 in terms of a Boolean expression can be obtained.

Corollary 2: Let $S_B$ and B be as above, and $N \leq N' \leq 2N-1$. Then $S_B$ preserves the roots of a median filter of window width $2N'+1$ if and only if (a) for all m such that $N - N' \leq m \leq N$, there exists a term in the MSP form of B that depends only on $\{x_{m+1}, \ldots, x_{m+N'+1}\}$.

(b) for all m such that $N - N' \leq m \leq N$, there exists no term in the MSP form of B that depends only on $\{x_1, \ldots, x_m\} \cup \{x_{m+N'+2}, \ldots, x_{2N-N'-m}\}$.

Finally, the convergence properties of stack filters are considered. For at least one stack filter, the median filter, convergence results have already been obtained. It has been shown that any signal on length L, once appended, will converge to a root of a given filter in at most $$\left|\frac{L-2}{2}\right|$$

passes of the filter.

This was later lowered to $$3\left|\frac{L-2}{2(N+2)}\right|$$

passes for a filter of window width $2N+1$. Such fast convergence does not necessarily occur for other stack filters. Some require L passes for signals of length L, and of course, it is not yet known if all stack filters do possess convergence properties. In other words, cycling has not yet been ruled out.

A sufficient condition for every appended input to a stack filter to converge to a median filter root in a finite number of passes of the filter is derived below. As mentioned before, this is a stronger result than the previous theorems about the preservation of median filter roots. It is possible that, for some input signal, the output of a stack filter will eventually cycle through a set of signals ad infinitum, and never converge.

Theorem 11:

Let $S_B$ be an M-level stack filter of window width $2N+1$, based on a positive Boolean function B. Then every appended M-level signal will converge to a root of a median filter of window width $2N+1$ after a finite number of passes of $S_B$ if (a) $B(0^N 1^{N+1})=1$ but for $\vec{X}_b < 0^N 1^{N+1}$, $B(\vec{X}_b)=0$.
(b) $B(1^N 0^{N+1})=0$ but for $\vec{X}_b > 1^N 0^{N+1}$, $B(\vec{X}_b)=1$.
(c) $B(1^{N+1} 0^N)=1$, but for $\vec{X}_b < 1^{N+1} 0^N$, $B(\vec{X}_b)=0$.
(d) $B(0^{N+1} 1^N)=0$, but for $\vec{X}_b > 0^{N+1} 1^N$, $B(\vec{X}_b)=1$.

The four conditions guarantee that the constant regions at the ends of the appended signal will grow into root-like regions on repeated passes of the filter, and that each root-like region must grow inwards by at least one sample position on each pass. When the two regions meet, the whole signal is a root of the median filter. This limits the number of passes to a root for these filters to $$\left|\frac{L-2}{2}\right|,$$

the same as that shown previously.

Corollary 3: Let $S_B$ be a stack filter of window width $2N+1$ that satisfies the conditions of the previous theroem. Then, any signal of unappended length L will, when appended, converge to a root of median filter of window width $2N+1$ in at most $$\left|\frac{L-2}{2}\right|$$

passes.

Finally, a version of Theorem 8 is obtained in terms of the MSP form of the Boolean function B.

Corollary 4: Let $S_B$ be a stack filter of window width $2N+1$, based on a positive Boolean function B. Then every appended M-level signal will converge to a root of a median filter of window width $2N+1$ after a finite number of passes of $S_B$ if (1) $X_1 \ldots X_{N+1}$ is a term in the MSP of B.
(2) $X_{N+1} \ldots X_{2N+1}$ is a term of the MSP of B.
(3) For each $i=1, \ldots, N+1$, there is a term of the MSP of B that contains only $X_i$ and variables from $\{X_{N+2}, \ldots, X_{2N+1}\}$.
(4) For each $i=N+1, \ldots, 2N+1$, there is a term in the MSP of B that contains only $X_i$ and variables from $\{X_1, \ldots, X_N\}$.

In fact, the median filter is not the only filter that satisfies Theorem 8 or Corollary 4. For $N>1$, the positive function $$B(X_1, \ldots, X_{2N+1}) = (X_1 \ldots X_N)(X_{N+1} + \ldots + X_{2N+1}) + (X_{N+2} \ldots X_{2N+1})(X_1 + \ldots + X_{N+1}) \quad (43)$$

defines another filter that satisfies the conditions of Corollary 4. It is easy to see that there are many other such filters. (For $N=1$, the only such filter is the median filter.) All these filters have exactly the same roots and, for each filter, every signal converges to a root. Thus, these filters can differ only in the way that each signal converges to a root.

There are exactly 20 positive functions of 3 variables, 7581 of 5 variables, and at least $2^{35}$ positive functions of 7 variables. Therefore, it is only practical to enumerate the stack filters with window width 3. The positive functions are listed according to the roots of the filters they produce and the filters' convergence properties are discussed below. Among these filters, there are several that are very useful.

The classification according to roots is as follows.

Constant Signals Only $B \equiv 0 - S_B$ preserves only identically 0 signals.

$B \equiv 1 - S_B$ preserves only identically $M-1$ signals.

The stack filters that preserve all constant signals, and nothing else, are based on the positive functions $X_1$
$X_3$
$X_1 X_3$
$X_1 X_2 X_3$
$X_1 + X_3$
$X_1 + X_2 + X_3$ Increasing Signals Only $X_2 X_3$
$X_1 + X_2$
$X_1 + X_2 X_3$
$X_1 X_3 + X_2 X_3$ Decreasing Signals Only $X_1 X_2$
$X_2 + X_3$
$X_3 + X_1 X_2$
$X_1 X_2 + X_1 X_3$ Other Signals $X_2$—preserves everything, as it is the identity function.

$X_1 X_2 + X_1 X_3 + X_2 X_3$—this produces the median filter of window width 3.

$X_2 + X_1 X_3$—the binary function preserves any appended signal in which each region of 0s has length 2 or more.

$X_1 X_2 + X_2 X_3$—this is the dual of the previous function, so the invariant binary appended signals are those in which every region of 1s has length 2 or more.

The last two filters will preserve a superset of the roots of the median filter of window width 3. The binary roots of the median filter are those signals in which each region of 0s or 1s has a length of at least 2. The multi-level roots are those appended signals in which every monotonically increasing or decreasing region is followed by a constant region of length 2 or more. The filter based on $X_2+X_1X_3$ preserves any appended signal in which every monotonically decreasing region is followed by a constant signal of length 2 or more, while the filter based on the dual function preserves inverted versions of these signals.

Also, while the median filter will eliminate both positive- and negative-going impulses, each of the two previous filters will eliminate impulses in only one direction. Given $(X_1,X_2,X_3)=(1,0,1)$, $X_2+X_1X_3=1$, the first filter will eliminate negative-going impulses. Similarly, the second filter will eliminate positive-going impulses.

Figure 26:
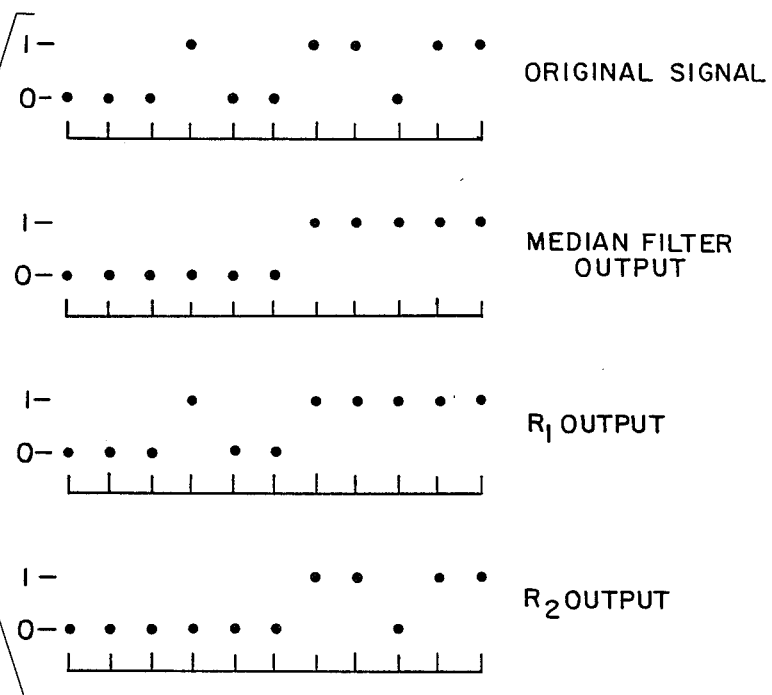
FIG. 26 is a schematic illustration of filtering with a median filter, with a positive-impulse-preserving asymmetric median filter ($R_1$), and with a negative-impulse-preserving asymmetric median filter ($R_2$).

Because of these properties, the two filters in question will be called asymmetric median filters. FIG. 26 shows the results of filtering a binary signal with a median filter of a window length 3 and with each of the two asymmetric median filters. Each filtered signal is a root of the corresponding filter.

For an independent, identically distributed (i.i.d.) input with distribution F(.), the output distribution for the median filter of window width 3 is $$F_m(Z)=3(F(Z))^2-2(F(Z))^3 \qquad (44)$$

while the output distributions of the two asymmetric median filters are $$F_1(Z)=2(F(Z))^2-(F(Z))^3 \qquad (45)$$

and $$F_2(Z)=F(Z)+(F(Z))^2-(F(Z))^3 \qquad (46)$$

respectively. Thus, it is easy to show that $F_1(Z) \leq F_m(Z) \leq F_2(Z)$ for all Z.

Of the filters that preserve only constant signals, those based on $X_1$ and $X_3$ are right- and left-shift operators. The functions $X_1X_2X_3$ and $X_1+X_2+X_3$ produce the familiar minimum and maximum operators, while $X_1X_3$ and $X_1+X_3$ correspond to minimum and maximum operators that do not depend on the central sample in the window. All these filters are more useful for their effects on signals after a few passes than for their root signals.

Each filter that preserves only increasing (decreasing) signals does, in fact, filter every appended signal to an increasing (decreasing) signal in a finite number of passes. The operations of finding the dual function and reversing the order of the variables will map a Boolean function of one class to one of the other class. Using both operations, in either order, will map a function to one of the same class. Therefore, only the functions $X_2X_3$ and $X_1X_3+X_2X_3$ need be considered.

First, consider $X_2X_3$: if $X_2=1$, then $X_2X_3=1$ if and only if $X_3=1$; if $X_2=0$, then $X_2X_3=0$. Hence, after each pass of the filter, every bit of a binary signal is preserved except for the last bit of any constant region of 1s. In other words, an appended binary signal converges to an increasing signal by the extension of each region of zeros to the left. Each zero region will extend by at least one bit on each pass. The final root will be 0 up to the last 0 bit of the original signal, and 1 thereafter.

Of course, the final M-level root of the corresponding stack filter is an increasing signal. Essentially, this root corresponds to the output of a negative peak detector with an infinite decay time, which starts from the right of the appended signal. Starting from the right, this signal decreases to the first negative peak, and remains constant until the first sample less than the first local minimum. This process repeats until the left end of the signal is reached.

Now, look at $X_1X_3+X_2X_3$: if $X_2=0$, the output is 0 if and only if $X_1=0$ or $X_3=0$; if $X_2=1$ the output is 1 if and only if $X_3=1$. On each pass of the filter, each zero region in a binary signal will extend to the left by at least one bit, except for isolated zeros which will move to the left on repeated passes of the filter. An isolated zero will stop moving when it meets a larger region of zeros. This, and the extension of such regions to the left, guarantees that the final binary root will be increasing. Hence, the M-level stack filter will eventually filter any M-level signal to an increasing signal.

The other filters that preserve only increasing or only decreasing signals can be obtained from these two by the dual-function and time-reversal operations. Therefore, they also will make all input signals converge to monotonic signals.

The asymmetric median filters may be useful in several areas. They could be used to eliminate spurious bright spots in an image, while preserving the rest of the image. Further, since they tend to eliminate impulses of one sign, but preserve those of the opposite sign, they could be used to process geological or biomedical signals, in which large impulses of one sign are the significant features of the signals.

The filters that preserve only monotonic signals would be useful in eliminating gray level gradients in an image. Using one of these filters to filter the rows of an image to roots, a gradient estimate for each row that contains essentially no local detail of the image is obtained. By subtracting each root from the original row, the gradient is eliminated but the details of the image are preserved.

A stack filter, as defined previously, may be more appropriately called a homogeneous stack filter because it performs the same binary operation on each threshold signal. For instance, the median filter is a stack filter in which the binary operation performed on each binary threshold signal is the binary median filtering operation. The median filter is therefore a homogeneous stack filter.

There is no fundamental reason to restrict the definition of a stack filter to those which perform the same binary operation on each threshold signal. Only the stacking property for the binary output signals produced by the binary operators needs to be maintained so that the reconstruction section of the filter can still be implemented as shown in FIG. 22.

Before all the filters in this desired class of filters can be determined, a definition is needed. Definition: An ordered set of K binary operators $B^1, B^2, \ldots, B^K$ is said to have the stacking property if and only if $B^i(X_1,X_2,\ldots,X_n) \leq B^{i+1}(Y_1,Y_2,\ldots,Y_n)$ for all $i=1,2,\ldots,K-1$ whenever $X_j \leq Y_j$, $j=1,2,\ldots,n$.

With this definition, the class of nonhomogeneous stack filters can be characterized. A filter is a nonhomogeneous stack filter if and only if applying the filter to a K valued input signal is equivalent to the following three step process:

(1) Decomposing the M-level signal into M−1 binary signals by thresholding it at each value between 1 and M−1. The kth threshold signal has the value 1 at a given position if and only if the input signal is at least k at that position; otherwise, it has the value 0.

(2) Filtering each of the M−1 threshold signals with the desired binary operator. In general, the binary operator $B^p$ operating on the p'th threshold signal will be different from the binary operator $B^q$ operating on the q'th threshold signal, where $p \neq q$. However, the binary operators $B^1, B^2, \ldots, B^{K-1}$ possess the stacking property. Since each signal is filtered independently, these M−1 binary operations can be implemented in parallel. Also, since these filters have only binary signals as inputs, they are easily implemented. Each filter is simply a logic operation, which is easily implemented in VLSI. Since each operator is binary, the output signals are also binary signals.

(3) Adding the binary outputs from all the filters to produce the output signal.

Thus, nonhomogeneous stack filters have the architecture shown in FIG. 6, but with the K−1 median filters indicated in that figure replaced by a family of binary operations which have the stacking property. The reconstruction section of the architecture for the nonhomogeneous stack filter has the implementation shown in FIG. 22. Many of the filters used in image processing can be shown to be nonhomogeneous stack filters.

Although the invention has been described in detail with reference to certain preferred embodiments and specific examples, variation and modifications exist within the scope and spirit of the invention as described and as defined in the following claims.

What is claimed is:

1. A circuit for decomposing an N-bit digital code word held in a storage register into a plurality of binary signals by threshold decomposition, wherein N is a positive integer, said circuit comprising:
   (a) a plurality of comparators, one comparator for each of said binary signals, each comparator having a unique N-bit value to which it compares the code word, each comparator having an output which it sets to "one" when the value of the code word is greater than or equal to its unique N-bit value and to "zero" otherwise;
   (b) each comparator having N cells coupled together, each cell of said comparator corresponding to a bit of the unique N-bit value for that comparator, each cell having a code word input coupled to a corresponding bit of the code word;
   (each cell comprising a first type ("type 1") cell when its corresponding bit of the unique N-bit value is a "one" and a second type ("type 0") cell when its corresponding bit of the unique N-bit value is a "zero"; and
   (d) the cells of each comparator coacting to generate a "one" at the output of the comparator when the code word is greater than or equal to the unique value of that comparator and a "zero" at the output of the comparator otherwise.

2. The circuit of claim 1 and further including means for producing a data reference signal and means for producing a liability reference signal, the cells of each comparator comprising a most significant cell and a least significant cell having their code word inputs coupled to the most significant bit and the least significant bit of the code word, respectively, each comparator having a data line coupled to the means for producing the data reference signal, the data line comprising the output of the comparator, each "type 1" cell of each comparator coupled to the data line of that comparator, each cell having a liability input coupled to a liability output of the next most significant cell, the liability input of the most significant cell coupled to the means for producing the liability reference signal, the liability input of each "type 1" cell coupled to its liability output so that its liability output follows its liability input, each "type 1" cell including means for forcing the data line to "zero" when its corresponding code word input is "zero" and its liability input is "one", and each "type 0" cell including means for propagating the liability signal from its liability input to the liability input of the next least significant cell when its corresponding code word bit is "zero" and not propagating the liability signal at its liability input to the liability input of the next least significant cell when its corresponding code word bit is "one".

3. The circuit of claim 2 wherein each "type 0" cell's means for propagating the liability signal at its liability input to the liability input of the next least significant cell when its corresponding code word bit is "zero" comprises means for coupling its liability output to its liability input so that its liability output follows its liability input when its corresponding code word bit is "zero" and decoupling its liability output from its liability input when its corresponding code word bit is "one".

4. The circuit of claim 2 wherein each "type 1" cell comprises a first transmission gate having its gate coupled to the corresponding code word bit for that cell, a second transmission gate having its gate coupled to an output of the first transmission gate, the first transmission gate having an input coupled to the liability input and output of that cell, and the second transmission gate has an input coupled to a "zero" logic level and an output coupled the data line to which the cell is coupled.

5. The circuit of claim 2 wherein each "type 0" cell comprises a transmission gate having its gate coupled to the corresponding code word bit of that cell, the transmission gate having an input coupled to the liability output of the next most significant cell and an output coupled to the liability input of the next least significant cell.

6. The circuit of claim 2 wherein each "type 1" cell comprises a first transmission gate having its gate coupled to the corresponding code word bit for that cell, a second transmission gate having its gate coupled to an output of the first transmission gate, the first transmission gate having an input coupled to the liability input and output of that cell, the second transmission gate having an input coupled to a "zero" logic level and an output coupled to the data line to which the cell is coupled, each "type 0" cell comprising a transmission gate having its gate coupled to the corresponding code word bit of that cell, the transmission gate having an input coupled to the liability output of the next most significant cell and an output coupled to the liability input of the next least significant cell.

7. A filter circuit for digitally filtering a binary word, the filter circuit having a window length of N bits wherein N is a positive integer, the filter circuit comprising:

(a) means for storing N bits of the binary word;

(b) a voltage divider circuit having a plurality of voltage divider legs, one leg for each of the N stored bits, each voltage divider leg coupled to one of the N stored bits, each voltage divider leg including means for pulling an output of the voltage divider circuit toward a first voltage level when the stored bit to which it is coupled is a "one" and toward a second voltage level when the stored bit to which it is coupled is a "zero;"

(c) means for producing a voltage reference; and (d) means for comparing the output of the voltage divider circuit to the voltage reference and producing at an output a result of the comparison which is a "one" when the output of the voltage divider circuit is greater than the voltage reference and a "zero" otherwise.

8. The circuit of claim 7 wherein each voltage divider leg comprises a pull-up MOS (metal oxide semiconductor) transistor having its drain coupled to a drain voltage source (VDD) and its gate coupled to the stored bit of the binary word to which the voltage divider leg is coupled, a pull-down MOS transistor having its source coupled to ground and its gate coupled to a complement of the stored bit of the binary word to which the voltage divider leg is coupled, the source of the first pull-up MOS transistor coupled to the drain of the pull-down MOS transistor and coupled to the output of the voltage divider circuit.

9. The circuit of claim 8 wherein the means for producing a voltage reference comprises a voltage reference circuit having a plurality of voltage reference legs, one voltage reference leg for each voltage divider leg, each voltage reference leg comprising a pull-up MOS transistor and a pull-down MOS transistor, the drain of the pull-up MOS transistor coupled to VDD and the source of the pull-down MOS transistor coupled to ground, the drain of the pull-down MOS transistor coupled to the source of the pull-up MOS transistor and to an output of the voltage reference circuit, the pull-up and pull-down MOS transistor of one voltage reference leg comprising "half-size" devices having conductivities of about one-half the conductivities of the pull-up and pull-down MOS transistors of the voltage reference legs which comprise "full-size" devices, the half-sized devices always being in an on (conducting) state, the full-size devices of the voltage reference circuit being user-selectable for being biased on and off to select the voltage reference.

10. The circuit of claim 9 wherein the means for storing the N bits of the binary word comprises a shift register including a plurality of stages, one stage for storing each of the N bits, each shift register stage having an output coupled to the gate of the pull-up MOS transistor of the voltage divider leg which is coupled to that bit of the stored N bits and also coupled through an inverter to the gate of the pull-down MOS transistor of the voltage divider leg coupled to that bit of the stored N bits.

11. The circuit of claim 10 and further including means for shifting the binary word through the shift register and means for storing the result of each comparison of the output of the voltage divider circuit and the voltage reference after each shift of the shift register, the stored results of the comparisons comprising the filtered binary word.

12. The circuit of claim 10 wherein N is equal to $2n+1$, where n is a positive integer, the stages of the shift register sequentially arranged from "one" to "$2n+1$" where the "one" stage of the shift register contains the most recent bit shifted into the shift register and the "$2n+1$" stage of the shift register contains the bit which will be the next bit shifted out of the shift register, and further including means for selecting between recursive and non-recursive filtering comprising means for feeding back the result of the comparison of the voltage reference with the output of the voltage divider circuit to the "$n+1$" stage of the shift register when recursive filtering is selected.

13. The circuit of claim 7 and further including a shift register having a plurality of stages, one stage for storing each of the N bits, the means for producing the voltage reference comprising a voltage reference circuit having an output at which it produces the voltage reference and a plurality of voltage reference legs, one voltage reference leg for each voltage divider leg, a plurality of cells, one cell for each of the stored N bits, each cell including;

(a) a stage of the shift register;

(b) one of the voltage divider legs;

(c) means for coupling the voltage divider leg of the cell to a shift register stage;

(d) one of the voltage reference legs;

(e) means for coupling an output of the voltage reference leg to the output of the voltage reference circuit; and (f) means for coupling an output of the voltage divider leg to the output of the voltage divider circuit.

14. The circuit of claim 13 wherein each cell's voltage divider leg comprises a pull-up MOS (metal oxide semiconductor) transistor having its drain coupled to a drain voltage source (VDD) and its gate coupled to the bit stored in the cell's shift register stage, a pull-down MOS transistor having its source coupled to ground and its gate coupled through an inverter to the bit stored in the cell's shift register stage and its drain coupled to the source of the pull-up MOS transistor and to the output of the voltage divider circuit; each cell's voltage reference leg comprising a pull-up MOS transistor and a pull-down MOS transistor, the drain of the voltage reference leg's pull-up MOS transistor coupled to VDD and the source of the voltage reference leg pull-down MOS transistor coupled to ground, the drain of the voltage reference leg pull-down MOS transistor coupled to the source of the voltage reference leg pull-up MOS transistor and to the output of the voltage reference circuit, the pull-up and pull-down MOS transistors of at least one cell's voltage reference leg comprising "half-size" devices having conductivities of about one-half the conductivities of the MOS transistors of the other cells' voltage reference legs which comprise "full-size" devices, the half-size devices always being in an on (conducting) state and the full-size devices being user selectable for being biased on and off to select the voltage reference.

* * * * *

UNITED STATES PATENT AND TRADEMARK OFFICE
CERTIFICATE OF CORRECTION

PATENT NO. : 4,868,773

DATED : September 19, 1989

INVENTOR(S) : Edward J. Coyle et al.

It is certified that error appears in the above-identified patent and that said Letters Patent is hereby corrected as shown below:

At column 2, line 68, please delete "0" and insert therefor --$\emptyset$--;

At column 9, line 22, please delete "theinput" and insert therefor --the input--;

At column 10, line 1, after the word "moving", please insert --left--;

At column 10, line 11, please delete "$1 \leq i \leq k; b-1$" and insert therefor --$1 \leq i \leq k-1$--;

At column 10, line 67, please delete "$1 \leq n \leq m; b-1$" and insert therefor --$1 \leq n \leq m-1$--;

At column 11, line 2, please delete "$X_r^q(n) \leq X_r^p(n) = 0$" and insert therefor --$X_r^q(n) \geq X_r^p(n) = 0$--;

At column 11, line 22, please delete "$T_0^p(n) = 1$" and insert therefor --$t_0^p(n) = 1$--;

At column 12, line 7, please delete "Involing" and insert therefor --Invoking--;

At column 17, line 33, please delete "recontructions" and insert therefor --reconstructions--;

At column 18, line 34, please delete "Beause" and insert therefor --Because--;

At column 20, line 15, please delete "$y_{60}(m)$" and insert therefor --$y_\alpha(m)$--;

At column 20, line 38, please delete "have" and insert therefor --has--;

UNITED STATES PATENT AND TRADEMARK OFFICE
CERTIFICATE OF CORRECTION

PATENT NO. : 4,868,773

DATED : September 19, 1989

INVENTOR(S) : Edward J. Coyle et al.

It is certified that error appears in the above-identified patent and that said Letters Patent is hereby corrected as shown below:

At column 21, line 23, please delete "so" and insert therefor --as--;

At column 21, lines 45-46, please delete "windown" and insert therefor --window--;

At column 23, line 56, please delete "regiser" and insert therefor --register--;

At column 33, line 8, please delete "$V_{OUT} < VREF$" and insert therefor --$V_{OUT} < V_{REF}$--;

At column 33, line 25, please delete "clip" and insert therefor --chip--;

At column 36, line 10, "0" (both occurrence) should read --$\emptyset$--;

At column 37, in Table 5, under the heading "Action", at line 1, please delete "0's" and insert therefor --$\emptyset$'s--.

Signed and Sealed this

Twenty-third Day of October, 1990

Attest:

HARRY F. MANBECK, JR.

Attesting Officer

Commissioner of Patents and Trademarks